United States Patent
Yamazaki

(10) Patent No.: US 9,449,852 B2
(45) Date of Patent: Sep. 20, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/316,065

(22) Filed: Jun. 26, 2014

(65) Prior Publication Data

US 2014/0308777 A1   Oct. 16, 2014

Related U.S. Application Data

(63) Continuation of application No. 13/085,812, filed on Apr. 13, 2011, now Pat. No. 8,790,960.

(30) Foreign Application Priority Data

Apr. 28, 2010  (JP) ................................. 2010-103472

(51) Int. Cl.
*H01L 21/00*   (2006.01)
*H01L 21/465*  (2006.01)
(Continued)

(52) U.S. Cl.
CPC ....... *H01L 21/465* (2013.01); *H01L 21/02554* (2013.01); *H01L 21/02565* (2013.01);
(Continued)

(58) Field of Classification Search
CPC ............... H01L 21/465; H01L 21/477; H01L 29/4908; H01L 29/7806; H01L 29/7869; H01L 29/66969
See application file for complete search history.

(56) References Cited

U.S. PATENT DOCUMENTS 5,610,097 A * 3/1997 Shimizu ............ H01L 21/32051
148/DIG. 139
5,731,856 A   3/1998 Kim et al.
(Continued)

FOREIGN PATENT DOCUMENTS

CN   101621075 A   1/2010
CN   101685835 A   3/2010
(Continued)

OTHER PUBLICATIONS

Kim.S et al., "High-Performance oxide thin film transistors passivated by various gas plasmas", 214th ECS Meeting, 2008, No. 2317, ECS.
(Continued)

*Primary Examiner* — Savitr Mulpuri
(74) *Attorney, Agent, or Firm* — Robinson Intellectual Property Law Office; Eric J. Robinson

(57) ABSTRACT

A semiconductor device including an oxide semiconductor with stable electric characteristics and high reliability is provided. An island-shaped oxide semiconductor layer is formed by using a resist mask, the resist mask is removed, oxygen is introduced (added) to the oxide semiconductor layer, and heat treatment is performed. The removal of the resist mask, introduction of the oxygen, and heat treatment are performed successively without exposure to the air. Through the oxygen introduction and heat treatment, impurities such as hydrogen, moisture, a hydroxyl group, or hydride are intentionally removed from the oxide semiconductor layer, whereby the oxide semiconductor layer is highly purified. Chlorine may be introduced to an insulating layer over which the oxide semiconductor layer is formed before formation of the oxide semiconductor layer. By introducing chlorine, hydrogen in the insulating layer can be fixed, thereby preventing diffusion of hydrogen from the insulating layer into the oxide semiconductor layer.

14 Claims, 13 Drawing Sheets

(51) Int. Cl.
  *H01L 21/02* (2006.01)
  *H01L 29/49* (2006.01)
  *H01L 29/786* (2006.01)
  *H01L 21/477* (2006.01)
  *H01L 29/66* (2006.01)

(52) U.S. Cl.
  CPC ... *H01L21/02631* (2013.01); *H01L 21/02664* (2013.01); *H01L 21/477* (2013.01); *H01L 29/4908* (2013.01); *H01L 29/66969* (2013.01); *H01L 29/7869* (2013.01); *H01L 29/78606* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,791,072 B2 | 9/2010 | Kumomi et al. |
| 7,791,074 B2 | 9/2010 | Iwasaki |
| 7,935,582 B2 | 5/2011 | Iwasaki |
| 7,956,361 B2 | 6/2011 | Iwasaki |
| 7,977,675 B2 | 7/2011 | Kawamura et al. |
| 7,994,500 B2 | 8/2011 | Kim et al. |
| 8,017,459 B2 | 9/2011 | Yang et al. |
| 8,058,645 B2 | 11/2011 | Jeong et al. |
| 8,129,718 B2 | 3/2012 | Hayashi et al. |
| 8,134,151 B2 | 3/2012 | Imai |
| 8,148,779 B2 | 4/2012 | Jeong et al. |
| 8,154,024 B2 | 4/2012 | Iwasaki |
| 8,178,884 B2 | 5/2012 | Ha et al. |
| 8,188,480 B2 | 5/2012 | Itai |
| 8,193,535 B2 | 6/2012 | Ha et al. |
| 8,203,143 B2 | 6/2012 | Imai |
| 8,293,595 B2 | 10/2012 | Yamazaki et al. |
| 8,384,077 B2 * | 2/2013 | Yano et al. ............ 257/43 |
| 8,426,243 B2 | 4/2013 | Hayashi et al. |
| 8,445,903 B2 * | 5/2013 | Inoue et al. ............ 257/43 |
| 8,461,583 B2 * | 6/2013 | Yano et al. ............ 257/43 |
| 8,728,862 B2 | 5/2014 | Ha et al. |
| 8,841,710 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0032812 A1 | 2/2009 | Herman et al. |
| 2009/0068773 A1 | 3/2009 | Lai et al. |
| 2009/0073325 A1 | 3/2009 | Kuwabara et al. |
| 2009/0108256 A1 | 4/2009 | Kwak et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2009/0325341 A1 | 12/2009 | Itagaki et al. |
| 2010/0006833 A1 | 1/2010 | Ha et al. |
| 2010/0012932 A1 | 1/2010 | Shieh et al. |
| 2010/0025677 A1 | 2/2010 | Yamazaki et al. |
| 2010/0035379 A1 | 2/2010 | Miyairi et al. |
| 2010/0038641 A1 | 2/2010 | Imai |
| 2010/0051937 A1 | 3/2010 | Kaji et al. |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127256 A1 | 5/2010 | Inoue et al. |
| 2010/0140599 A1 | 6/2010 | Yano et al. |
| 2010/0155716 A1 | 6/2010 | Cheong et al. |
| 2010/0163863 A1 | 7/2010 | Yaegashi |
| 2010/0193782 A1 | 8/2010 | Sakata |
| 2010/0301328 A1 | 12/2010 | Yamazaki et al. |

(56) References Cited

U.S. PATENT DOCUMENTS

| | | |
|---|---|---|
| 2011/0095288 A1 | 4/2011 | Morosawa |
| 2011/0136301 A1 | 6/2011 | Yamazaki et al. |
| 2011/0193083 A1 | 8/2011 | Kim et al. |
| 2011/0260157 A1 | 10/2011 | Yano et al. |
| 2011/0269266 A1 | 11/2011 | Yamazaki |
| 2012/0119205 A1 | 5/2012 | Taniguchi et al. |
| 2012/0138923 A1 | 6/2012 | Hara et al. |
| 2012/0225543 A1 | 9/2012 | Ohno et al. |
| 2013/0207106 A1 | 8/2013 | Hayashi et al. |
| 2015/0060850 A1 | 3/2015 | Yamazaki et al. |
| 2015/0108477 A1 | 4/2015 | Tokunaga |

FOREIGN PATENT DOCUMENTS

| | | |
|---|---|---|
| EP | 1737044 A | 12/2006 |
| EP | 2141743 A | 1/2010 |
| EP | 2144294 A | 1/2010 |
| EP | 2157615 A | 2/2010 |
| EP | 2159844 A | 3/2010 |
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073558 A | 3/2007 |
| JP | 2007-073560 A | 3/2007 |
| JP | 2007-103918 A | 4/2007 |
| JP | 2008-060419 A | 3/2008 |
| JP | 2009-231613 A | 10/2009 |
| JP | 2009-260002 A | 11/2009 |
| JP | 2010-016163 A | 1/2010 |
| JP | 2010-016347 A | 1/2010 |
| JP | 2010-016348 A | 1/2010 |
| JP | 2010-021520 A | 1/2010 |
| JP | 2010-040552 A | 2/2010 |
| JP | 2010-056546 A | 3/2010 |
| JP | 2010-062229 A | 3/2010 |
| JP | 2010-062549 A | 3/2010 |
| JP | 2010-067954 A | 3/2010 |
| JP | 2010-073894 A | 4/2010 |
| JP | 2010-074138 A | 4/2010 |
| JP | 2010-080936 A | 4/2010 |
| KR | 2010-0002504 A | 1/2010 |
| KR | 2010-0019381 A | 2/2010 |
| TW | 201015720 | 4/2010 |
| WO | WO-2004/114391 | 12/2004 |
| WO | WO-2007/029844 | 3/2007 |
| WO | WO-2008/123270 | 10/2008 |
| WO | WO-2008/136505 | 11/2008 |
| WO | WO-2008/139860 | 11/2008 |
| WO | WO-2009/034953 | 3/2009 |
| WO | WO-2010/001783 | 1/2010 |
| WO | WO-2010/024279 | 3/2010 |

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Societty of Applied Physics.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et al., "Oxygen Vacancies in ZnO", Appl. Phys. Lett. (Applied Physics Letters), 2005, vol. 87, pp. 122102-1-122102-3.

Park.J et al., "Improvements in the Device Characteristics of Amorphous Indium Gallium Zinc Oxide Thin-Film Transistors By Ar Plasma Treatments", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Tsuda.K et al., "Ultra Low Power Consumption Technologies for Mobile TFT-LCDs", IDW '02 : Proceedings of the 9th International Display Workshops, Dec. 4, 2002, pp. 295-298.

Lee.H et al., "Current Status of, Challenges to, and Perspective View of AM-OLED", IDW '06 : Proceedings of the 13th International Display Workshops, Dec. 7, 2002, pp. 663-666.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Mo.Y et al., "Amorphous Oxide TFT Backplanes for Large Size AMOLED Displays", IDW '08 : Proceedings of the 6th International Display Workshops, Dec. 3, 2008, pp. 581-584.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Dembo.H et al., "RFCPUS on Glass and Plastic Substrates Fabricated by TFT Transfer Technology", IEDM 05: Technical Digest of International Electron Devices Meeting, Dec. 5, 2008, pp. 1067-1069.

Park.J et al., "High performance amorphous oxide thin film transistors with self-aligned top-gate structure", IEDM 09: Technical Digest of International Electron Devices Meeting, Dec. 7, 2009, pp. 191-194.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Masuda.S et al., "Transparent thin film transistors using ZnO as an active channel layer and their electrical properties", J. Appl. Phys. (Journal of Applied Physics), Feb. 1, 2003, vol. 93 No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Asakuma.N. et al., "Crystallization and Reduction of sol-gel-Derived Zinc Oxide Films by Irradiation With Ultraviolet Lamp", Journal of Sol-gel Science and Technology, 2003, vol. 26, pp. 181-184.

Kimizuka.N. et al., "Spinel,YbFe2O4, and Yb2Fe3O7 Types of Structures for Compounds in the In2O3 and Sc2O3—A2O3—BO Systems [A; Fe, Ga, or, Al; B: Mg, Mn, Fe, Ni, Cu,or Zn] at Temperatures Over 1000 ° C.", Journal of Solid State Chemistry, 1985, vol. 60, pp. 382-384.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemisrty, Apr. 1, 1995, vol. 116, No. 1, pp. 170-178.

Kurokawa.Y et al., "UHF RFCPUS on Flexible and Glass Substrates for Secure RFID Systems", Journal of Solid-State Circuits, 2008, vol. 43, No. 1, pp. 292-299.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Kitzerow.H et al., "Observation of Blue Phases in Chiral Networks", Liquid Crystals, 1993, vol. 14, No. 3, pp. 4303-4308.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Kikuchi.H et al., "Polymer-Stabilized Liquid Crystal Blue Phases", Nature Materials, Sep. 2, 2002, vol. 1, pp. 64-68.

Nakamura.M, "Synthesis of Homologous Compound with New Long-Period Structure", NIRIM Newsletter, Mar. 1, 1995, vol. 150, pp. 1-4.

Orita.M et al., "Amorphous transparent conductive oxide InGaO3(ZnO)m (m<4):a Zn4s conductor", Philosophical Magazine, 2001, vol. 81, No. 5, pp. 501-515.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Janotti.A et al., "Native Point Defects in ZnO", Phys. Rev. B (Physical Review. B), Oct. 4, 2007, vol. 76, No. 16, pp. 165202-1-165202-22.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Hosono.H, "68.3:Invited Paper:Transparent Amorphous Oxide Semiconductors for High Performance TFT", SID International Symposium Digest of Technical Papers, 2007, vol. 38, pp. 1830-1833.

Miyasaka.M, "SUFTLA Flexible Microelectronics on Their Way to Business", SID Digest '07 : SID International Symposium Digest of Technical Papers, 2007, vol. 38, pp. 1673-1676.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008 vol. 39, pp. 1277-1280.

Lee.J et al., "World's Largest (15-Inch) XGA AMLCD Panel Using IGZO Oxide TFT", SID Digest '08 : SID International Symposium Digest of Technical Papers, May 20, 2008 vol. 39, pp. 625-628.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Cho.D et al., "21.2:Al and Sn-doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Clark.S et al., "First Principles Methods Using CASTEP", Zeitschrift fur Kristallographie, 2005, vol. 220, pp. 567-570.

International Search Report (Application No. PCT/JP2011/058747) Dated Jul. 19, 2011.

Written Opinion (Application No. PCT/JP2011/058747) Dated Jul. 19, 2011.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 100113545), dated May 22, 2015.

* cited by examiner

METHOD FOR MANUFACTURING SEMICONDUCTOR DEVICE

TECHNICAL FIELD

An embodiment of the present invention relates to a semiconductor device and a method for manufacturing the semiconductor device.

Note that in this specification, a semiconductor device refers to any device that can function by utilizing semiconductor characteristics, and an image pick-up device, a display device, an electro-optical device, a power supply device, a semiconductor circuit, and an electronic device are all semiconductor devices.

BACKGROUND ART

Attention has been focused on a technique for forming a transistor (also referred to as a thin film transistor (TFT)) using a semiconductor thin film formed over a substrate having an insulating surface. The transistor is applied to a wide range of electronic devices such as an integrated circuit (IC) or an image display device (display device). A silicon-based semiconductor material is widely known as a material for a semiconductor thin film applicable to the transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

However, the electric conductivity of an oxide semiconductor changes when deviation from the stoichiometric composition due to excess or deficiency of oxygen or the like occurs, or hydrogen or moisture forming an electron donor enters the oxide semiconductor, during a manufacturing process of a device. Such a phenomenon becomes a factor of variation in the electric characteristics of a transistor including an oxide semiconductor.

In view of the above problems, it is an object to provide a semiconductor device including an oxide semiconductor, which has stable electric characteristics and high reliability.

In order to suppress variation in the electric characteristics of a transistor including an oxide semiconductor, impurities such as hydrogen, moisture, a hydroxyl group, or hydride (also referred to as a hydrogen compound) which cause the variation are intentionally removed from the oxide semiconductor. In addition, oxygen which is a main component of the oxide semiconductor and is reduced in the step of removing the impurities is supplied. The oxide semiconductor is thus highly purified and becomes electrically i-type (intrinsic).

An i-type (intrinsic) oxide semiconductor is an oxide semiconductor which is made to be i-type (intrinsic) or substantially i-type (intrinsic) by being highly purified by removing hydrogen, which is an n-type impurity, from the oxide semiconductor so that impurities that are not a main component of the oxide semiconductor are contained as little as possible. In other words, a feature is that a highly purified i-type (intrinsic) semiconductor or a semiconductor close thereto is obtained not by adding an impurity but by removing an impurity such as hydrogen or water as much as possible. This enables the Fermi level ($E_f$) to be at the same level as the intrinsic Fermi level ($E_i$).

Oxygen is introduced (added) to a bulk of an oxide semiconductor and then heat treatment is performed. Through these steps of oxygen introduction and heat treatment, impurities such as hydrogen, moisture, a hydroxyl group, or hydride (also referred to as a hydrogen compound) are intentionally removed from the oxide semiconductor, whereby the oxide semiconductor is highly purified. By the introduction of oxygen, a bond between a metal included in the oxide semiconductor and hydrogen or a bond between the metal and a hydroxyl group is cut, and the hydrogen or the hydroxyl group is reacted with oxygen to produce water; this leads to easy elimination of the hydrogen or the hydroxyl group that is an impurity as water by the heat treatment performed later. In addition, through the heat treatment, the structure of the oxide semiconductor can be ordered, and the number of defect levels in the energy gap can be reduced. Further, the number of defects generated at the interface between the oxide semiconductor and an insulating layer in contact with the oxide semiconductor can be reduced.

Note that the term "bulk" is used in order to clarify that oxygen is added not only to a surface of a thin film but also to the inside of the thin film. The introduction of oxygen can also be referred to as "oxygen doping". Note that "oxygen doping" in this specification means that oxygen (which includes at least one of an oxygen radical, an oxygen atom, and an oxygen ion) is added to a bulk.

The oxygen doping (also referred to as oxygen doping treatment) can be performed by oxygen plasma doping in which oxygen that is made into plasma is added to a bulk. Specifically, oxygen is made into plasma with the use of radio-frequency (RF) power, and oxygen radicals and/or oxygen ions are introduced to an oxide semiconductor over a substrate. At this time, it is preferable to apply a bias to the substrate over which the oxide semiconductor is formed. By increasing the bias applied to the substrate, oxygen can be introduced more deeply. The oxygen doping may be performed by an ion implantation method or an ion doping method.

In the manufacturing process of a transistor including an oxide semiconductor, in the oxide semiconductor (bulk), an oxygen excess region where the amount of oxygen is greater than that in the stoichiometric proportion can be provided through oxygen doping treatment. In the oxygen excess region, the amount of oxygen is preferably greater than that in the stoichiometric proportion and less than four times of that in the stoichiometric proportion, more preferably greater than that in the stoichiometric proportion and less than double of that in the stoichiometric proportion. Here, an oxide containing excessive oxygen whose amount is greater than that in the stoichiometric proportion refers to, for example, an oxide which satisfies $2g>3a+3b+2c+4d+3e+2f$ when the oxide is represented by $In_aGa_bZn_cSi_dAl_eMg_fO_g$ (a, b, c, d, e, f, g≥0). Note that oxygen which is added by the oxygen doping treatment may exist between lattices of the oxide semiconductor.

Note that in the case where an oxide semiconductor has no defects (oxygen deficiency), the amount of oxygen contained in the oxide semiconductor may be equal to that in the stoichiometric proportion. However, in order to ensure reliability, for example, to suppress variation in the threshold voltage of a transistor, an oxide semiconductor preferably contains oxygen whose amount is greater than that in the stoichiometric proportion.

With dehydration or dehydrogenation by heat treatment subjected to an oxide semiconductor, a hydrogen atom or an impurity containing a hydrogen atom such as water in the oxide semiconductor is removed, so that the oxide semiconductor is highly purified. The amount of oxygen added by oxygen doping treatment is set to greater than that of hydrogen in the highly purified oxide semiconductor which has been subjected to the dehydration or dehydrogenation.

In addition, a cap layer may be formed on and in contact with an oxide semiconductor, and oxygen may be introduced to the oxide semiconductor through the cap layer. By the introduction of oxygen through the cap layer, excessive damage to the oxide semiconductor in oxygen doping treatment can be alleviated. When oxygen is introduced by an ion implantation method or an ion doping method, the oxygen introduction depth (introduction region) can be easily controlled, whereby oxygen can be efficiently introduced to the oxide semiconductor.

By using gallium oxide for the cap layer, charge buildup at the introduction of oxygen can be relieved, and excessive damage to the oxide semiconductor can be further alleviated. Further, by using a metal oxide including the same kind of component as the oxide semiconductor for the cap layer, accumulation of hydrogen ions at the interface between the metal oxide and the oxide semiconductor and the vicinity thereof can be suppressed or prevented. Specifically, as the metal oxide, it is preferable to use a material containing an oxide of one or more of metal elements selected from constituent elements of the oxide semiconductor.

When the metal oxide is used for the cap layer and heat treatment is performed while the oxide semiconductor and the cap layer are in contact with each other, oxygen which is one of the main components of the oxide semiconductor and is reduced in the step of removing impurities, can be supplied from the metal oxide to the oxide semiconductor. Thus, the oxide semiconductor is more highly purified to become electrically i-type (intrinsic).

The electric characteristics of a transistor including a highly purified oxide semiconductor, such as the threshold voltage and the on-state current, have almost no temperature dependence. Further, transistor characteristics hardly change owing to light deterioration.

As described above, variation in the electric characteristics of a transistor including a highly purified and electrically i-type (intrinsic) oxide semiconductor is suppressed and the transistor is electrically stable. Consequently, a semiconductor device including an oxide semiconductor, which has high reliability and stable electric characteristics, can be provided.

In addition, chlorine doping (also referred to as chlorine doping treatment) may be performed on an insulating layer over which an oxide semiconductor is formed before formation of the oxide semiconductor. Specifically, chlorine is made into plasma with the use of radio-frequency (RF) power, and chlorine radicals and/or chlorine ions are introduced to the insulating layer over a substrate. At this time, it is preferable to apply a bias to the substrate over which the insulating layer is formed. By increasing the bias applied to the substrate, chlorine can be introduced more deeply. The chlorine doping may be performed by an ion implantation method or an ion doping method.

By introducing chlorine to the insulating layer over which the oxide semiconductor is formed, hydrogen in the insulating layer can be fixed, so that diffusion of hydrogen from the insulating layer into the oxide semiconductor can be prevented. Oxygen may be introduced at the same time as chlorine.

According to an embodiment of the present invention, a method for manufacturing a semiconductor device includes the steps of: forming a resist mask over an oxide semiconductor layer, forming an island-shaped oxide semiconductor layer by using the resist mask, removing the resist mask, introducing oxygen to the island-shaped oxide semiconductor layer, and performing heat treatment on the island-shaped oxide semiconductor layer. The step of removing the resist mask, the step of introducing oxygen to the island-shaped oxide semiconductor layer, and the step of performing the heat treatment on the island-shaped oxide semiconductor layer are successively performed without exposure to the air.

According to an embodiment of the present invention, a method for manufacturing a semiconductor device includes the steps of: performing chlorine doping treatment on an insulating layer over which an oxide semiconductor layer is formed before formation of the oxide semiconductor layer, forming a resist mask over the oxide semiconductor layer, forming an island-shaped oxide semiconductor layer by using the resist mask, removing the resist mask, introducing oxygen to the island-shaped oxide semiconductor layer, and performing heat treatment on the island-shaped oxide semiconductor layer. The step of removing the resist mask, the step of introducing oxygen to the island-shaped oxide semiconductor layer, and the step of performing the heat treatment on the island-shaped oxide semiconductor layer are successively performed without exposure to the air.

According to an embodiment of the present invention, a method for manufacturing a semiconductor device includes the steps of: forming a cap layer over an oxide semiconductor layer, forming a resist mask over the cap layer, forming an island-shaped oxide semiconductor layer and an island-shaped cap layer by using the resist mask, removing the resist mask, introducing oxygen to the island-shaped oxide semiconductor layer through the island-shaped cap layer, and performing heat treatment on the island-shaped oxide semiconductor layer. The step of removing the resist mask, the step of introducing oxygen to the island-shaped oxide semiconductor layer, and the step of performing the heat treatment on the island-shaped oxide semiconductor layer are successively performed without exposure to the air.

Oxygen introduced to the oxide semiconductor layer includes an oxygen radical or an oxygen ion.

In addition, the step of removing the resist mask, the step of introducing oxygen to the island-shaped oxide semiconductor layer, and the step of performing the heat treatment on the island-shaped oxide semiconductor layer are performed in a reduce pressure atmosphere, an inert gas atmosphere, or an oxygen gas atmosphere without exposure to the air.

The effect of the invention disclosed in this specification can be easily understood in consideration of the following, but the following description is just one consideration.

When a positive voltage is applied to a gate electrode of a transistor, an electric field is generated from a gate electrode side of an oxide semiconductor layer to a back channel side (the side opposite to a gate insulating film). Therefore, hydrogen ions having positive charge which exist in the oxide semiconductor layer are transferred to the back channel side, and accumulated at the oxide semiconductor layer side of the interface between the oxide semiconductor layer and an insulating layer. The positive charge is transferred from the accumulated hydrogen ions to charge trapping centers (such as a hydrogen atom, water, or contamination) in the insulating layer, whereby negative charge is accumulated at the back channel side of the oxide semiconductor layer. In other words, a parasitic channel is generated at the back channel side of the transistor, and the threshold voltage is shifted to the negative side, so that the transistor tends to be normally-on.

In this manner, the charge trapping center such as hydrogen or water in the insulating layer traps the positive charge and the positive charge is transferred into the insulating layer, whereby the electrical characteristics of the transistor change. Accordingly, in order to suppress variation in the electrical characteristics of the transistor, it is important that there is no charge trapping centers or the number of the charge trapping centers is small in the insulating layer. Therefore, when the insulating layer is formed, a sputtering method which causes less hydrogen contained in the formed insulating layer is preferably used. In an insulating layer formed by a sputtering method, there is no charge trapping centers or a small number of charge trapping centers, and the transfer of positive charge does not easily occur as compared to the case of using a CVD method or the like. Therefore, the shift of the threshold voltage of the transistor can be suppressed, and the transistor can be normally-off.

Note that in a top-gate transistor, when an oxide semiconductor layer is formed over an insulating layer serving as a base and then heat treatment is performed thereon, not only water or hydrogen contained in the oxide semiconductor layer but also water or hydrogen contained in the insulating layer can be removed. Accordingly, in the insulating layer, there are a small number of charge trapping centers for trapping positive charge transferred through the oxide semiconductor layer. In this manner, since the heat treatment for dehydration or dehydrogenation is also performed on the insulating layer located below the oxide semiconductor layer in addition to the oxide semiconductor layer, in the top-gate transistor, the insulating layer serving as a base may be formed by a CVD method such as a plasma CVD method.

Note that in a bottom-gate transistor, when an oxide semiconductor layer is formed over a gate insulating layer and then heat treatment is performed thereon, not only water or hydrogen contained in the oxide semiconductor layer but also water or hydrogen contained in the gate insulating layer can be removed. Accordingly, in the gate insulating layer, there are a small number of charge trapping centers for trapping positive charge transferred through the oxide semiconductor layer. In this manner, since the heat treatment for dehydration or dehydrogenation is also performed on the gate insulating layer located below the oxide semiconductor layer in addition to the oxide semiconductor layer, in the bottom-gate transistor, the gate insulating layer may be formed by a CVD method such as a plasma CVD method.

In addition, when a negative voltage is applied to the gate electrode, an electric field is generated from the back channel side to the gate electrode side in the oxide semiconductor layer. Thus, hydrogen ions which exist in the oxide semiconductor layer are transferred to the gate insulating layer side and accumulated at the oxide semiconductor layer side of the interface between the oxide semiconductor layer and the gate insulating layer. As a result, the threshold voltage of the transistor is shifted to the negative side.

When the negative voltage is applied to the gate electrode and then the electric field is stopped and this state is kept, the positive charge is released from the charge trapping centers, so that the threshold voltage of the transistor is shifted to the positive side, thereby returning to the initial state, or the threshold voltage is shifted to the positive side beyond that in the initial state in some cases. From these phenomena, it can be considered that easy-to-transfer ions exist in the oxide semiconductor layer and hydrogen that is the smallest atom is transferred most easily.

In addition, when an oxide semiconductor layer absorbs light, a bond between a metal element (M) and a hydrogen atom (H) (also referred to as an M-H bond) in the oxide semiconductor layer is cut by optical energy. Note that the optical energy of light having a wavelength of approximately 400 nm equals or substantially equals to the bond energy of a metal element and a hydrogen atom. When a negative gate bias is applied to a transistor in which a bond of a metal element and a hydrogen atom in an oxide semiconductor layer is cut, a hydrogen ion detached from a metal element is attracted to a gate electrode side, so that distribution of charge is changed, the threshold voltage of the transistor is shifted to the negative side, and the transistor tends to be normally-on.

Note that hydrogen ions which are transferred to the interface with a gate insulating layer by light irradiation and application of the negative gate bias to the transistor are returned to the initial state by stopping application of the voltage. This can be regarded as a typical example of the ion transfer in the oxide semiconductor layer.

In order to prevent such a variation in the electric characteristics by voltage application (BT deterioration) or a variation in the electric characteristics by light irradiation (light deterioration), it is most important to remove a hydrogen atom or an impurity containing a hydrogen atom such as water thoroughly from an oxide semiconductor layer to highly purify the oxide semiconductor layer. A charge density of $10^{15}$ cm$^{-3}$, or a charge per unit area of $10^{10}$ cm$^{-2}$ does not affect the transistor characteristics or affects them very slightly. Therefore, it is preferable that the charge density be less than or equal to $10^{15}$ cm$^{-3}$. When 10% of hydrogen contained in the oxide semiconductor layer is transferred within the oxide semiconductor layer, the hydrogen concentration is preferably less than or equal to $10^{16}$ cm$^{-3}$. Further, in order to prevent entry of hydrogen from the outside after a device is completed, it is preferable that a silicon nitride layer formed by a sputtering method be used as a passivation layer to cover the transistor.

Hydrogen or water can also be removed from the oxide semiconductor layer by doping with excessive oxygen as compared to hydrogen contained in the oxide semiconductor layer (such that (the number of hydrogen atoms)<<(the number of oxygen radicals) or (the number of oxygen ions)). Specifically, oxygen is made into plasma by radio-frequency (RF) power, a bias of a substrate is increased, and doping with or addition of an oxygen radical and/or an oxygen ion is performed on the oxide semiconductor layer over the substrate such that the amount of oxygen is larger than that of hydrogen in the oxide semiconductor layer. The electronegativity of oxygen is 3.0 which is larger than about 2.0, the electronegativity of a metal (Zn, Ga, In) in the oxide semiconductor layer. Thus, excessive oxygen contained as compared to hydrogen, deprives an M-H bond of a hydrogen atom, so that an OH group is formed. This OH group may form an M-O—H group by being bonded to M.

Oxygen doping is preferably performed so that the amount of oxygen contained in the oxide semiconductor layer is greater than that in the stoichiometric proportion of the oxide semiconductor. For example, in the case where an In—Ga—Zn—O-based oxide semiconductor layer is used as the oxide semiconductor layer, since an ideal ratio in the case of single crystal is 1:1:1:4 (InGaZnO$_4$), it is preferable that the number of O atoms be greater than 4 and less than 8 (the amount of oxygen be greater than that in the stoichiometric proportion and less than double of that in the stoichiometric proportion) by oxygen doping.

Optical energy or BT stress detaches a hydrogen ion from an M-H bond, which causes deterioration; however, in the case where oxygen is implanted by the above-described doping, implanted oxygen is bonded to a hydrogen ion, so that an OH group is formed. The OH group does not discharge a hydrogen ion even by light irradiation or application of BT stress on the transistor because of its high bond energy, and is not easily transferred in the oxide semiconductor layer because of its larger mass than the mass of a hydrogen ion. Accordingly, an OH group formed by oxygen doping does not cause deterioration of the transistor or can reduce factors of the deterioration.

In addition, it has been confirmed that as the thickness of an oxide semiconductor layer is increased, variation in the threshold voltage of a transistor tends to increase. It can be assumed that this is because an oxygen defect in the oxide semiconductor layer is one cause of the variation in the threshold voltage and the number of oxygen defects increases as the thickness of the oxide semiconductor layer is increased. A step of doping an oxide semiconductor layer with oxygen in a transistor according to an embodiment of the present invention is effective not only for removal of hydrogen or water from the oxide semiconductor layer but also for compensation of an oxygen defect in the layer. Accordingly, the variation in the threshold voltage can be controlled in the transistor according to an embodiment of the present invention.

Metal oxide layers each containing the same kind of component as an oxide semiconductor layer may be provided with the oxide semiconductor layer provided therebetween, which is also effective for prevention of variation in the electrical characteristics. As the metal oxide layer containing the same kind of component as the oxide semiconductor layer, specifically, a material containing an oxide of one or more metal elements selected from constituent elements of the oxide semiconductor layer is preferably used. Such a material is compatible with the oxide semiconductor layer, and therefore, provision of the metal oxide layers with the oxide semiconductor layer provided therebetween enables the interface between the metal oxide layer and the oxide semiconductor layer to be kept well. That is, by providing the metal oxide layer using the above-described material as an insulating layer which is in contact with the oxide semiconductor layer, since hydrogen ions are mainly diffused in the metal oxide layer, accumulation of hydrogen ions at the interface between the metal oxide layer and the oxide semiconductor layer and in the vicinity thereof can be suppressed or prevented. Accordingly, as compared to the case where insulating layers each containing a different component from that of the oxide semiconductor layer, such as silicon oxide layers, are provided with the oxide semiconductor layer provided therebetween, the hydrogen concentration at the interface of the oxide semiconductor layer, which affects the threshold voltage of the transistor, can be sufficiently decreased.

Gallium oxide is preferably used for the metal oxide layer. Since gallium oxide has a wide band gap (Eg), by providing gallium oxide layers with the oxide semiconductor layer provided therebetween, an energy barrier is formed at the interface between the oxide semiconductor layer and the metal oxide layer to prevent carrier transfer at the interface. Consequently, carriers are not transferred from the oxide semiconductor to the metal oxide, but are transferred within the oxide semiconductor layer. On the other hand, hydrogen ions pass through the interface between the oxide semiconductor layer and the metal oxide layer and are accumulated in the vicinity of a surface of the metal oxide layer which is opposite to a surface in contact with the oxide semiconductor layer, for example. The above region is apart from a region where carriers flow, which results in no affect or a very slight affect on the threshold voltage of the transistor. When gallium oxide is in contact with an In—Ga—Zn—O-based material, the energy barrier is about 0.8 eV on the conduction band side and about 0.9 eV on the valence band side.

A transistor including an oxide semiconductor subjected to dehydration or dehydrogenation by heat treatment and oxygen doping treatment is a transistor having high reliability in which the amount of change in the threshold voltage by the bias-temperature stress (BT) test can be reduced.

Consequently, in accordance with an embodiment of the present invention, a transistor having stable electric characteristics can be manufactured.

In addition, in accordance with an embodiment of the present invention, a semiconductor device including a transistor, which has favorable electric characteristics and high reliability, can be manufactured.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to the description of the embodiments below.

A transistor is a kind of semiconductor element and can achieve amplification of a current or a voltage, switching operation for controlling conduction or non-conduction, or the like. A transistor in this specification includes an insulated-gate field effect transistor (IGFET) and a thin film transistor (TFT).

There is no particular limitation on the structure of a transistor disclosed in this specification or the like. For example, a staggered type and a planar type of a top-gate structure or a bottom-gate structure can be used. Further, the transistor may have a single gate structure including one channel formation region, a double gate structure including two channel formation regions, or a triple gate structure including three channel formation regions.

In addition, a function of "source" and a function of "drain" are sometimes interchanged with each other depending on the operating conditions of a transistor or the like. Therefore, the terms "source" and "drain" can be interchanged with each other in this specification.

Note that the ordinal numbers such as "first" and "second" in this specification are used for convenience and do not denote the order of steps and the stacking order of layers. In addition, the ordinal numbers in this specification do not denote particular names which specify the invention.

[Embodiment 1]

In this embodiment, an embodiment of a semiconductor device and a method for manufacturing the semiconductor device will be described with reference to FIGS. 1A to 1E and FIG. 5A. In this embodiment, as an example of the semiconductor device, a transistor including an oxide semiconductor for a semiconductor layer in which a channel is formed will be described in detail.

Figure 1A:
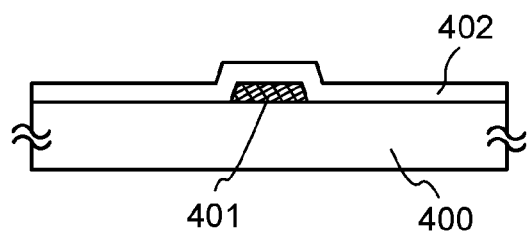
FIGS. 1A to 1E illustrate an embodiment of a semiconductor device and a method for manufacturing the semiconductor device.
Figure 1B:
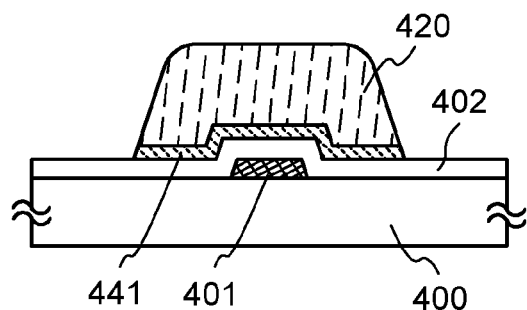
Figure 1C:
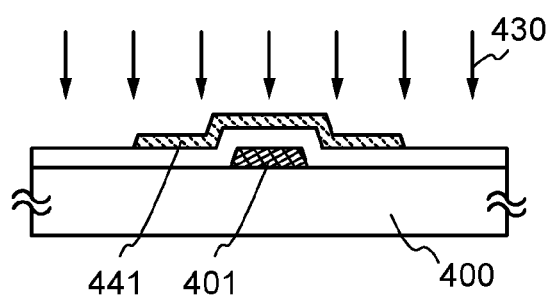
Figure 1D:
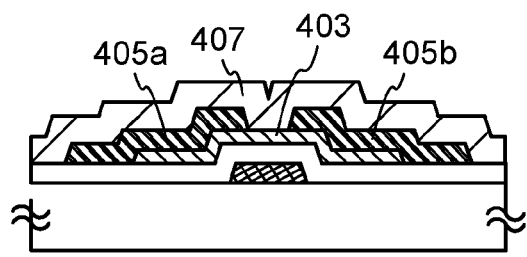
Figure 1E:
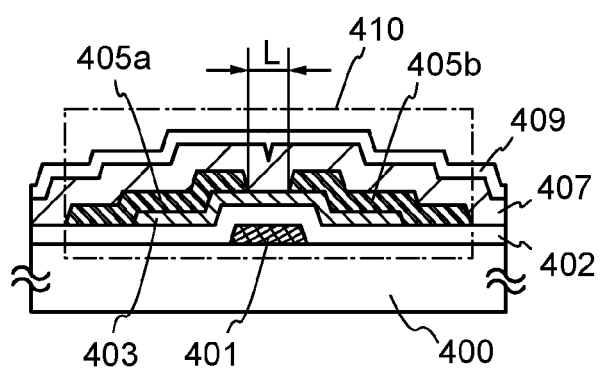

A transistor 410 illustrated in FIG. 1E includes, over a substrate 400, a gate electrode layer 401, a gate insulating layer 402, an oxide semiconductor layer 403, a source electrode layer 405a, and a drain electrode layer 405b. An insulating layer 407 (also referred to as a first insulating layer) and a protective insulating layer 409 (also referred to as a second insulating layer) are stacked over the transistor 410 in this order. The transistor 410 is one of bottom-gate transistors, and is also one of inverted staggered transistors.

FIGS. 1A to 1E illustrate an example of a method for manufacturing the transistor 410.

First, a conductive layer is formed over the substrate 400, and then, the gate electrode layer 401 is formed through a first photolithography step. Note that a resist mask may be formed by an inkjet method. Formation of the resist mask by an inkjet method needs no photomask; thus, manufacturing cost can be reduced.

There is no particular limitation on a substrate which can be used as the substrate 400, and a glass substrate, a ceramic substrate, a quartz substrate, a sapphire substrate, a crystallized glass substrate, or the like can be used.

Further, a flexible substrate may be used as the substrate 400. In the case where a flexible substrate is used, a transistor may be directly formed over a flexible substrate. Alternatively, a transistor may be formed over a manufacturing substrate, and then, the transistor may be separated from the manufacturing substrate and transferred to a flexible substrate. Note that in order to separate the transistor from the manufacturing substrate and transfer it to the flexible substrate, a separation layer may be provided between the manufacturing substrate and the transistor.

A base layer may be provided between the substrate 400 and the gate electrode layer 401. The base layer can be formed to have a single-layer structure or a stacked-layer structure using one or more of silicon nitride, silicon oxide, silicon nitride oxide, and silicon oxynitride and has a function of preventing diffusion of impurity elements from the substrate 400.

When a halogen element such as chlorine or fluorine is contained in the base layer, a function of preventing diffusion of impurity elements from the substrate 400 can be further improved. The concentration of a halogen element to be contained in the base layer is measured by secondary ion mass spectrometry (SIMS) and its peak is preferably greater than or equal to $1\times10^{15}/cm^3$ and less than or equal to $1\times10^{20}/cm^3$.

Gallium oxide may be used for the base layer. Alternatively, a stacked-layer structure of a gallium oxide layer and the above insulating layer may be used for the base layer. Gallium oxide is a material which is hardly charged; therefore, variation in the threshold voltage due to charge buildup of the insulating layer can be suppressed.

The gate electrode layer 401 can be formed to have a single-layer structure or a stacked-layer structure using a metal material such as molybdenum (Mo), titanium (Ti), tantalum (Ta), tungsten (W), aluminum (Al), copper (Cu), chromium (Cr), neodymium (Nd), scandium (Sc), or magnesium (Mg), or an alloy material containing any of these as a main component.

Then, the gate insulating layer 402 is formed over the gate electrode layer 401 (see FIG. 1A). The gate insulating layer 402 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate ($HfSi_xO_y$ (x>0, y>0)), hafnium aluminate ($HfAl_xO_y$ (x>0, y>0)), hafnium silicate to which nitrogen is added, hafnium aluminate to which nitrogen is added, or the like by a plasma CVD method, a sputtering method, or the like. The gate insulating layer 402 is not limited to a single layer, and a stacked layer of different layers may be used. For example, by a plasma CVD method, a silicon nitride ($SiN_y$ (y>0)) layer may be formed as a first gate insulating layer, and a silicon oxide ($SiO_x$ (x>0)) layer may be formed as a second gate insulating layer over the first gate insulating layer, so that a gate insulating layer can be formed.

An oxide semiconductor described in this embodiment is an i-type or substantially i-type oxide semiconductor from which impurities are removed and which is highly purified so as to contain an impurity that serves as a carrier donor and is a substance other than the main component of the oxide semiconductor as little as possible.

Such a highly purified oxide semiconductor is highly sensitive to an interface state and interface charge; thus, an interface between the oxide semiconductor layer and the gate insulating layer is important. For that reason, the gate insulating layer that is to be in contact with a highly purified oxide semiconductor needs to have high quality.

For example, a high-density plasma CVD method using microwaves (e.g., a frequency of 2.45 GHz) is preferably adopted because an insulating layer formed can be dense and can have high withstand voltage and high quality. The highly purified oxide semiconductor and the high-quality gate insulating layer are in close contact with each other, whereby the interface state can be reduced to obtain favorable interface characteristics.

Needless to say, another film formation method such as a sputtering method or a plasma CVD method can be employed as long as the method enables formation of a good-quality insulating layer as a gate insulating layer. Further, an insulating layer whose film quality and characteristics of the interface with the oxide semiconductor are improved by heat treatment which is performed after formation of the insulating layer may be used. In any case, any insulating layer may be used as long as the insulating layer has characteristics of enabling reduction in interface state density of the interface with the oxide semiconductor and formation of a favorable interface as well as having favorable film quality as a gate insulating layer.

In addition, an insulating material containing the same kind of component as the oxide semiconductor is preferably used for the gate insulating layer 402. This is because such a material is compatible with the oxide semiconductor, and therefore, the use of such a material for the gate insulating layer 402 enables a state of the interface between the gate insulating layer 402 and the oxide semiconductor to be kept well. Here, containing "the same kind of component as the oxide semiconductor" means containing one or more of elements selected from constituent elements of the oxide semiconductor. For example, in the case where the oxide semiconductor is formed using an In—Ga—Zn-based oxide semiconductor material, gallium oxide or the like is given as such an insulating material containing the same kind of component as the oxide semiconductor.

As a far preferable example of a stacked-layer structure for the gate insulating layer 402, a stacked-layer structure of a layer (hereinafter referred to as a layer a) formed using the insulating material containing the same kind of component as the oxide semiconductor and a layer (hereinafter referred to as a layer b) formed using a material different from the component material of the layer a can be given. This is because with a structure in which the layer a and the layer b are stacked from the oxide semiconductor layer side in order, charge is preferentially trapped by a charge trapping center at the interface between the layers a and b (as compared to the interface between the oxide semiconductor and the layer a), so that charge trapping at the interface of the oxide semiconductor can be sufficiently suppressed, leading to improvement in the reliability of the semiconductor device.

Further, in order that hydrogen, a hydroxyl group, and moisture might be contained in the gate insulating layer 402 and the oxide semiconductor layer as little as possible, it is preferable that, as pretreatment before formation of the oxide semiconductor layer, the substrate 400 over which layers up to and including the gate electrode layer 401 are formed or the substrate 400 over which layers up to and including the gate insulating layer 402 are formed be preheated in a preheating chamber of a sputtering apparatus so that impurities such as hydrogen and moisture adsorbed to the substrate 400 are eliminated and removed. As an evacuation unit provided in the preheating chamber, a cryopump is preferable. Note that this preheating treatment can be omitted. Further, this preheating may be similarly performed on the substrate 400 over which layers up to and including the source electrode layer 405a and the drain electrode layer 405b are formed, before formation of the insulating layer 407.

Next, over the gate insulating layer 402, an oxide semiconductor layer with a thickness of greater than or equal to 2 nm and less than or equal to 200 nm, preferably greater than or equal to 5 nm and less than or equal to 30 nm is formed.

Note that before the oxide semiconductor layer is formed by a sputtering method, powder substances (also referred to as particles or dusts) which are attached on a surface of the gate insulating layer 402 are preferably removed by reverse sputtering in which an argon gas is introduced and plasma is generated. The reverse sputtering refers to a method in which an RF power source is used for application of voltage to a substrate side in an atmosphere of a rare gas such as argon and plasma is generated around the substrate to modify a surface. Note that a nitrogen gas, a helium gas, an oxygen gas, or the like may be used in place of an argon gas.

Before formation of the oxide semiconductor layer, chlorine may be introduced to an insulating layer (the gate insulating layer 402 in this embodiment) over which the oxide semiconductor layer is formed, by a method similar to oxygen plasma doping described later, by using a chlorine gas (a gas containing chlorine such as $Cl_2$, $SiCl_4$, or the like) instead of an oxygen gas. Alternatively, chlorine may be introduced by an ion implantation method or an ion doping method which will be described in Embodiment 2.

By introducing chlorine to the insulating layer over which the oxide semiconductor layer is formed, hydrogen in the insulating layer can be fixed, so that diffusion of hydrogen from the insulating layer into the oxide semiconductor layer can be prevented. Oxygen may be introduced to the insulating layer at the same time as chlorine. Note that chlorine or the like is preferably introduced under the condition where damage to the interface between the insulating layer and the oxide semiconductor layer can be minimized.

A metal oxide containing In, a metal oxide containing In and Ga, or the like can be used as the oxide semiconductor used for the oxide semiconductor layer. In addition, the following metal oxides can also be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, or a Zn—O-based oxide semiconductor; and the like. Further, $SiO_2$ may be contained in the above oxide semiconductor. Here, for example, an In—Ga—Zn—O-based oxide semiconductor means an oxide containing indium (In), gallium (Ga), and zinc (Zn), and there is no particular limitation on the composition ratio thereof.

For the oxide semiconductor layer, a thin film of a material expressed by a chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

In this embodiment, the oxide semiconductor layer is formed using an In—Ga—Zn—O-based oxide target by a sputtering method. In addition, the oxide semiconductor layer can be formed by a sputtering method in a rare gas (typically, argon) atmosphere, an oxygen atmosphere, or a mixed atmosphere containing a rare gas and oxygen.

As a target for forming the oxide semiconductor layer by a sputtering method, for example, an oxide target having a composition ratio of $In_2O_3:Ga_2O_3:ZnO=1:1:1$ [molar ratio] is used to form an In—Ga—Zn—O layer. Without limitation to the material and the component of the target, for example, an oxide target having a composition ratio of $In_2O_3:Ga_2O_3:ZnO=1:1:2$ [molar ratio] may be used.

In the case where an In—Zn—O-based material is used as the oxide semiconductor, a target used has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=1:2 to 10:1 in a molar ratio), more preferably In:Zn=1.5:1 to 15:1 in an atomic ratio (In$_2$O$_3$:ZnO=3:4 to 15:2 in a molar ratio). For example, when a target used for forming the In—Zn—O-based oxide semiconductor has a composition ratio of In:Zn:O=X:Y:Z in an atomic ratio, Z>(1.5X+Y).

Furthermore, the filling rate of an oxide target is greater than or equal to 90% and less than or equal to 100%, preferably greater than or equal to 95% and less than or equal to 99.9%. With the use of a metal oxide target having a high filling rate, a dense oxide semiconductor can be formed.

It is preferable to use a high-purity gas from which impurities such as hydrogen, water, a hydroxyl group, or hydride are removed as a sputtering gas used when the oxide semiconductor layer is formed.

When the oxide semiconductor layer is formed, the substrate is held in a film formation chamber kept under reduced pressure, and the substrate temperature is set to a temperature of higher than or equal to 100° C. and lower than or equal to 600° C., preferably higher than or equal to 200° C. and lower than or equal to 400° C. By heating the substrate during film formation, the impurity concentration in the oxide semiconductor layer formed can be reduced. In addition, damage by sputtering can be reduced. Then, a sputtering gas from which hydrogen and moisture have been removed is introduced to the film formation chamber while moisture remaining therein is removed, and the oxide semiconductor layer is formed over the substrate 400 with the use of the above target. In order to remove moisture remaining in the film formation chamber, an entrapment vacuum pump such as a cryopump, an ion pump, or a titanium sublimation pump is preferably used. As an evacuation unit, a turbo molecular pump provided with a cold trap may be used. In a film formation chamber which is evacuated with a cryopump, for example, a hydrogen atom, a compound containing a hydrogen atom, such as water (H$_2$O), (more preferably, also a compound containing a carbon atom), and the like are removed, whereby the concentration of impurities in an oxide semiconductor layer formed in the film formation chamber can be reduced.

As one example of the film formation condition, the distance between the substrate and the target is 100 mm, the pressure is 0.6 Pa, the power of the direct-current (DC) power source is 0.5 kW, and the atmosphere is an oxygen atmosphere (the proportion of the oxygen flow is 100%). Note that a pulsed direct-current power source is preferably used, in which case powder substances (also referred to as particles or dusts) that are generated in film formation can be reduced and the film thickness can be uniform.

Next, first heat treatment is performed. By the first heat treatment, excessive hydrogen (including water and a hydroxyl group) in the oxide semiconductor layer is removed (dehydration or dehydrogenation) and the structure of the oxide semiconductor layer is ordered, so that defect levels in the energy gap can be reduced. In addition, defects at the interface between the oxide semiconductor layer and the insulating layer in contact with the oxide semiconductor layer can be reduced.

The first heat treatment is preferably performed at higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, more preferably less than or equal to ppb in the case where measurement is performed using a dew-point meter of a cavity ring-down laser spectroscopy (CRDS) system). For example, the substrate is put in an electric furnace which is a kind of heat treatment apparatus, and the oxide semiconductor layer is subjected to heat treatment at 450° C. for one hour in a nitrogen atmosphere.

Note that the heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA may be performed as follows. The substrate is transferred and put in an inert gas heated to a high temperature of higher than or equal to 650° C. and lower than or equal to 700° C., is heated for several minutes, and is transferred and taken out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or a rare gas which is introduced to the heat treatment apparatus be set to be greater than or equal to 6N (99.9999%), preferably greater than or equal to 7N (99.99999%) (that is, the impurity concentration is less than or equal to 1 ppm, preferably less than or equal to 0.1 ppm).

Next, through a second photolithography step, the oxide semiconductor layer is processed into an island-shaped oxide semiconductor layer 441 (see FIG. 1B). A resist mask 420 for forming the island-shaped oxide semiconductor layer 441 may be formed by an inkjet method. A photomask is not used when the resist mask 420 is formed by an inkjet method, which results in reducing manufacturing costs.

In the case where a contact hole is formed in the gate insulating layer 402, a step of forming the contact hole can be performed at the same time as processing of the oxide semiconductor layer.

Note that the etching of the oxide semiconductor layer may be dry etching, wet etching, or both dry etching and wet etching. As an etchant used for wet etching for the oxide semiconductor layer, for example, a mixed solution of phosphoric acid, acetic acid, and nitric acid, or the like can be used. Alternatively, ITO-07N (produced by KANTO CHEMICAL CO., INC.) may be used.

Then, by performing ashing treatment in an oxygen atmosphere, the resist mask 420 formed over the oxide semiconductor layer 441 is decomposed and removed. As the ashing treatment, photoexcited ashing in which the resist mask is removed by promoting chemical reaction with oxygen by irradiation with light such as ultraviolet light in an atmosphere of oxygen such as ozone, or plasma ashing in which the resist mask is decomposed and removed by oxygen that is made into plasma by using radio-frequency power or the like can be used. By removing the resist mask by the ashing treatment, it is possible that the oxide semiconductor layer 441 contains water, hydrogen, or hydrocarbon as little as possible.

Then, oxygen 430 is introduced to the oxide semiconductor layer 441. The introduction of the oxygen 430 can be performed by oxygen plasma doping. Specifically, the oxygen 430 is made into plasma with the use of radio-frequency (RF) power, and oxygen radicals and/or oxygen ions are introduced to the oxide semiconductor layer over the substrate. At this time, it is preferable to apply a bias to the substrate over which the oxide semiconductor layer 441 is formed. By increasing the bias applied to the substrate, the oxygen 430 can be introduced more deeply.

Through the oxygen plasma doping, the oxygen 430 is supplied to the oxide semiconductor layer 441, so that the amount of oxygen in the oxide semiconductor layer 441 is greater than that in the stoichiometric proportion of the oxide semiconductor (preferably less than double of that in the stoichiometric proportion). This is because, when the amount of oxygen is too large, the oxide semiconductor layer 441 might absorb hydrogen like a hydrogen absorbing alloy (hydrogen storing alloy). When the amount of oxygen in the case of single crystal is Y, the amount of oxygen in the oxide semiconductor layer 441 is greater than Y, preferably greater than Y and less than 2Y. Alternatively, by setting the amount of oxygen Z in the oxide semiconductor in the case where the oxygen doping treatment is not performed as a reference, the amount of oxygen in the case where the oxygen doping treatment is performed can be expressed as follows: "the amount of oxygen is greater than Z, preferably, greater than Z and less than 2Z". The oxygen 430 introduced to the oxide semiconductor layer 441 by doping includes an oxygen radical, an oxygen atom, and/or an oxygen ion. Accordingly, the amount of oxygen is greater than that of hydrogen in the oxide semiconductor.

For example, when the composition of the oxide semiconductor layer 441 is expressed by InGaZnOx, the chemical formula derived from the single crystal structure of an oxide in which In:Ga:Zn=1:1:1 is $InGaZnO_4$; therefore, the oxide semiconductor layer 441 having an oxygen excess region in which x is greater than 4 and less than 8 is formed. In a similar manner, when the composition of the oxide semiconductor layer 441 is expressed by $InGaZn_2Ox$, the oxide semiconductor layer 441 having an oxygen excess region in which x is greater than 5 and less than 10 is formed. Note that the oxygen excess region has only to exist in part (including the interface) of the oxide semiconductor layer.

In the oxide semiconductor layer, oxygen is one of the main components. Thus, it is difficult to accurately estimate the oxygen concentration of the oxide semiconductor layer by a method such as secondary ion mass spectrometry (SIMS). In other words, it is hard to determine whether oxygen is intentionally added to the oxide semiconductor layer.

Isotopes such as $O^{17}$ or $O^{18}$ exist in oxygen, and it is known that the existence proportions of them in nature are about 0.037% and about 0.204% of the whole oxygen atoms. That is to say, it is possible to measure the concentrations of these isotopes in the oxide semiconductor layer by a method such as SIMS; therefore, the oxygen concentration of the oxide semiconductor layer may be able to be estimated more accurately by measuring the concentrations of these isotopes. Thus, the concentrations of these isotopes may be measured to determine whether oxygen is intentionally added to the oxide semiconductor layer.

For example, with respect to the concentration of $O^{18}$, the concentration of the isotope of oxygen in an oxygen-added region D1 ($O^{18}$) and the concentration of the isotope of oxygen in a non-oxygen-added region D2 ($O^{18}$) have a relationship represented by D1 ($O^{18}$)>D2 ($O^{18}$).

The oxygen 430 added to (contained in) the oxide semiconductor layer 441 preferably has at least partly a dangling bond of oxygen in the oxide semiconductor. This is because, with the dangling bond, the oxygen 430 can be bonded to hydrogen which can remain in the layer, so that the hydrogen can be fixed (made to be an immovable ion).

Oxygen for the doping (an oxygen radical, an oxygen atom, and/or an oxygen ion) may be supplied from a plasma generating apparatus with the use of a gas containing oxygen or from an ozone generating apparatus. More specifically, for example, the oxygen 430 can be generated with an apparatus for etching treatment on a semiconductor device, an apparatus for ashing on a resist mask, or the like to process the oxide semiconductor layer 441.

An example of a plasma apparatus (also referred to as an ashing apparatus) for performing the oxygen plasma doping will be described with reference to FIGS. 6A and 6B. Note that the apparatus is industrially suitable as compared to an ion implantation apparatus or the like because the apparatus can be applicable to a large-sized glass substrate of the fifth generation or later, for example.

Figure 6A:
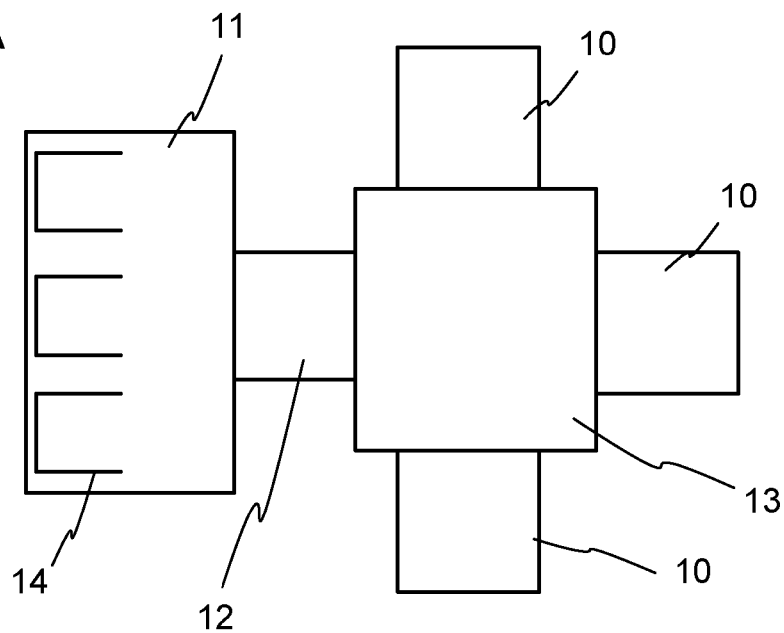
FIG. 6A is a top view and FIG. 6B is a cross-sectional view each illustrating an embodiment of a plasma apparatus.

FIG. 6A is a top view of a single wafer multi-chamber equipment. FIG. 6B is a cross-sectional view of a plasma apparatus (also referred to as an ashing apparatus) used for oxygen plasma doping.

Figure 6B:
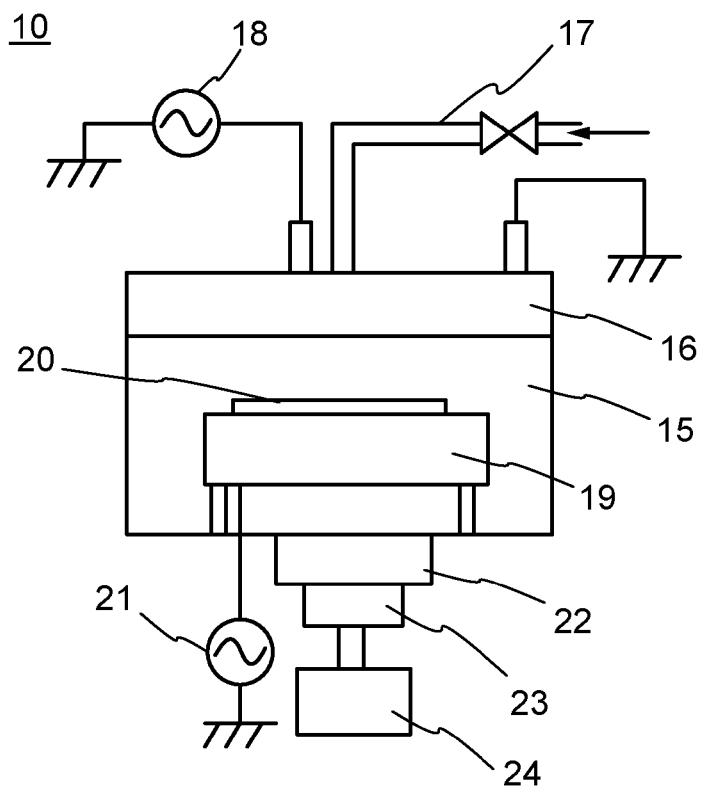

The single wafer multi-chamber equipment illustrated in FIG. 6A includes three plasma apparatuses 10 each of which is illustrated in FIG. 6B, a substrate supply chamber 11 including three cassette ports 14 for holding a substrate to be treated, a load lock chamber 12, a transfer chamber 13, and the like. A substrate supplied to the substrate supply chamber is transferred through the load lock chamber 12 and the transfer chamber 13 to a vacuum chamber 15 in the plasma apparatus 10 and is subjected to oxygen plasma doping. The substrate which has been subjected to oxygen plasma doping is transferred from the plasma apparatus, through the load lock chamber and the transfer chamber, to the substrate supply chamber. Note that a transfer robot for transferring a substrate to be treated is provided in each of the substrate supply chamber 11 and the transfer chamber 13.

Referring to FIG. 6B, the plasma apparatus 10 includes the vacuum chamber 15. A plurality of gas outlets and an ICP coil (an inductively coupled plasma coil) 16 which is a generation source of plasma are provided on a top portion of the vacuum chamber 15.

The twelve gas outlets are arranged in a center portion, seen from the top of the plasma apparatus 10. Each of the gas outlets is connected to a gas supply source for supplying an oxygen gas, through a gas flow path 17. The gas supply source includes a mass flow controller and the like and can supply an oxygen gas to the gas flow path 17 at a desired flow (which is greater than 0 sccm and less than or equal to 1000 sccm). The oxygen gas supplied from the gas supply source is supplied from the gas flow path 17, through the twelve gas outlets, into the vacuum chamber 15.

The ICP coil 16 includes a plurality of strip-like conductors, each of which has a spiral form. One end of each of the conductors is electrically connected to a first radio-frequency power source 18 (13.56 MHz) through a matching circuit for adjusting impedance, and the other end thereof is grounded.

A substrate stage 19 functioning as a lower electrode is provided in a lower portion of the vacuum chamber. By an electrostatic chuck or the like provided for the substrate stage 19, a substrate 20 to be treated is held on the substrate stage so as to be detachable. The substrate stage 19 is provided with a heater as a heating system and a He gas flow pass as a cooling system. The substrate stage is connected to a second radio-frequency power source 21 (3.2 MHz) for applying a substrate bias voltage.

In addition, the vacuum chamber 15 is provided with an exhaust port and an automatic pressure control valve (also referred to as an APC) 22. The APC is connected to a turbo molecular pump 23 and further, connected to a dry pump 24 through the turbo molecular pump 23. The APC controls the inside pressure of the vacuum chamber. The turbo molecular pump 23 and the dry pump 24 reduce the inside pressure of the vacuum chamber 15.

Next, described is an example in which plasma is generated in the vacuum chamber 15 illustrated in FIG. 6B, and oxygen plasma doping is performed on an oxide semiconductor layer provided for the substrate 20 to be treated.

First, the inside pressure of the vacuum chamber 15 is held at a desired pressure by operating the turbo molecular pump 23, the dry pump 24, and the like, and then, the substrate 20 to be treated is installed on the substrate stage in the vacuum chamber 15. Note that the substrate 20 to be treated held on the substrate stage has at least an oxide semiconductor layer. In this embodiment, the inside pressure of the vacuum chamber 15 is held at 1.33 Pa. Note that the flow of the oxygen gas supplied from the gas outlets into the vacuum chamber 15 is set to 250 sccm.

Next, radio-frequency power is applied from the first radio-frequency power source 18 to the ICP coil 16, thereby generating plasma. Then, a state in which plasma is being generated is kept for a certain period (longer than or equal to 30 seconds and shorter than or equal to 600 seconds). Note that the radio-frequency power applied to the ICP coil 16 is greater than or equal to 1 kW and less than or equal to 10 kW. In this embodiment, the radio-frequency power is set to 6000 W. At this time, a substrate bias voltage may be applied from the second radio-frequency power source 21 to the substrate stage. In this embodiment, the power of the substrate bias voltage is set to 1000 W.

In this embodiment, the state in which plasma is being generated is kept for 60 seconds and then, the substrate 20 to be treated is transferred from the vacuum chamber 15. In this manner, oxygen plasma doping can be performed on the oxide semiconductor layer provided for the substrate 20 to be treated.

In addition, the introduction of the oxygen 430 can be performed by an ion implantation method or an ion doping method described in Embodiment 2.

When the oxygen is introduced to the oxide semiconductor layer by the oxygen plasma doping, the removal of the resist mask and the oxygen plasma doping can be performed successively without interruption in the same vacuum chamber. That is, the removal of the resist mask and the oxygen plasma doping can be performed successively without exposure to the air. In addition, there is a possibility that components of the resist mask which has been decomposed and removed remain in the atmosphere inside the vacuum chamber. In order to remove the residual components from the atmosphere, after the removal of the resist mask and before the oxygen plasma doping, generation of oxygen plasma is stopped temporarily, and filling with and removal of an inert gas or an oxygen gas are preferably performed at least once, on the vacuum chamber in which the substrate to be treated is placed.

When the removal of the resist mask 420 formed over the oxide semiconductor layer 441 and the introduction of the oxygen 430 to the oxide semiconductor layer 441 are performed in different vacuum chambers or different apparatuses, the substrate to be treated is transferred while setting the atmosphere around the substrate to be treated to a reduced pressure atmosphere, an inert gas atmosphere, or an oxygen gas atmosphere so that the oxide semiconductor layer 441 is not exposed to the air while the substrate to be treated is transferred. In the above manner, impurities such as water, hydrogen, or hydrocarbon can be prevented from being attached to the surface of the oxide semiconductor layer 441, so that the impurities can be prevented from entering the oxide semiconductor during the introduction of the oxygen 430 (see FIG. 1C).

The oxygen 430 is introduced to the oxide semiconductor layer 441, so that the oxide semiconductor layer 441 which contains excessive oxygen is formed. The electronegativity of oxygen is 3.0 which is larger than about 2.0, the electronegativity of a metal (Zn, Ga, In) in the oxide semiconductor layer, and thus, excessive oxygen contained as compared to hydrogen deprives the M-H bond of a hydrogen atom, so that an OH group is formed. This OH group may form an M-O—H group by being bonded to M.

That is, by the introduction of oxygen, a bond between a metal included in the oxide semiconductor and hydrogen or a bond between the metal and a hydroxyl group is cut. At the same time, the hydrogen or the hydroxyl group reacts with oxygen to produce water. In particular, oxygen having a dangling bond easily reacts with hydrogen remaining in the oxide semiconductor to produce water. Consequently, hydrogen or a hydroxyl group which is an impurity can be easily eliminated as water in second heat treatment performed later.

After the introduction of the oxygen 430 to the oxide semiconductor layer 441, the second heat treatment is performed in a reduced pressure atmosphere, an inert gas atmosphere, or an oxygen gas atmosphere without exposure to the air (preferably at higher than or equal to 200° C. and lower than or equal to 600° C., for example, at higher than or equal to 250° C. and lower than or equal to 550° C.). For example, the second heat treatment is performed at 450° C. for one hour in a nitrogen atmosphere. It is preferable that the above atmosphere do not contain water, hydrogen, or the like.

Through the above steps of the introduction of the oxygen 430 and the heat treatment, dehydration or dehydrogenation of the oxide semiconductor layer can be performed, and impurities containing hydrogen molecules such as hydrogen, moisture, a hydroxyl group, or hydride (also referred to as a hydrogen compound) which cannot be removed thoroughly in the first heat treatment can be removed from the oxide semiconductor layer 441. In addition, defects generated at the interface between the oxide semiconductor layer and the insulating layer in contact with the oxide semiconductor layer can be reduced. As a result, the oxide semiconductor layer 441 can be changed into the oxide semiconductor layer 403 which is highly purified and made electrically i-type.

Next, a conductive layer for forming the source electrode layer 405a and the drain electrode layer 405b (including a wiring formed in the same layer as the source electrode layer 405a and the drain electrode layer 405b) is formed over the gate insulating layer 402 and the oxide semiconductor layer 403. As the conductive layer for forming the source electrode layer 405a and the drain electrode layer 405b, for example, a single-layer structure or a stacked-layer structure can be formed using a metal material including an element selected from Al, Cr, Cu, Ta, Ti, Mo, W, and Mg, an alloy material containing any of the above elements as its main component, or a metal nitride containing any of the above elements as its component (e.g., titanium nitride, molybdenum nitride, or tungsten nitride). Alternatively, a refractory metal film of Ti, Mo, W, or the like or a metal nitride film of any of these elements (a titanium nitride film, a molybdenum nitride film, or a tungsten nitride film) may be stacked on one of or both a lower side and an upper side of a metal layer of Al, Cu, or the like. Further alternatively, the conductive layer for forming the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

A resist mask is formed over the conductive layer through a third photolithography step. The conductive layer is etched selectively, so that the source electrode layer 405a and the drain electrode layer 405b are formed. Then, the resist mask is removed.

The channel length L of the transistor 410 is determined by the distance between the source electrode layer 405a and the drain electrode layer 405b which are in contact with the oxide semiconductor layer 403 (see FIG. 1E).

In order to reduce the number of photomasks used in a photolithography step and reduce the number of photolithography steps, an etching step may be performed with the use of a resist mask formed using a multi-tone mask which is a light-exposure mask through which light is transmitted to have a plurality of intensities. A resist mask formed using a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by using one multi-tone mask. Thus, the number of light-exposure masks can be reduced and the number of corresponding photolithography steps can be reduced, whereby simplification of a process can be realized.

Note that it is preferable that etching conditions be optimized so as not to etch and divide the oxide semiconductor layer 403 when the conductive layer is etched. However, it is difficult to obtain etching conditions in which only the conductive layer is etched and the oxide semiconductor layer 403 is not etched at all. In some cases, only part of the oxide semiconductor layer 403 is etched to obtain an oxide semiconductor layer having a groove portion (a recessed portion) when the conductive layer is etched.

In this embodiment, since a titanium (Ti) film is used as the conductive layer and an In—Ga—Zn—O-based oxide semiconductor is used as the oxide semiconductor layer, ammonium hydrogen peroxide (a solution in which 31 wt. % hydrogen peroxide, 28 wt. % ammonia water, and water are mixed at a volume ratio of 2:1:1) may be used as an etchant of the conductive layer.

Next, the insulating layer 407 is formed over the source electrode layer 405a and the drain electrode layer 405b to be in contact with part of the oxide semiconductor layer 403 (see FIG. 1D).

The insulating layer 407 can be formed to a thickness of at least 1 nm using a method by which impurities such as water and hydrogen do not enter the insulating layer 407, such as a sputtering method, as appropriate. A formation method of the insulating layer 407 is not particularly limited; for example, a film formation method such as plasma CVD method or sputtering method can be used. A sputtering method is appropriate in terms of low possibility of entry of hydrogen, water, and the like. When hydrogen is contained in the insulating layer 407, entry of the hydrogen into the oxide semiconductor layer or extraction of oxygen from the oxide semiconductor layer by the hydrogen is caused, thereby making the resistance of the backchannel (a region of a semiconductor layer which is not on the gate electrode layer side; in the transistor 410, a region of the oxide semiconductor layer 403 which is around the interface with the insulating layer 407) of the oxide semiconductor layer low (to have an n-type conductivity), so that a parasitic channel might be formed. Therefore, it is important to form the insulating layer 407 by a method by which hydrogen and an impurity containing hydrogen are not contained therein.

As the insulating layer 407, an inorganic insulating material such as silicon oxide, silicon oxynitride, hafnium oxide, aluminum oxide, or gallium oxide can be typically used. Gallium oxide is a material which is hardly charged; therefore, variation in the threshold voltage due to charge buildup of the insulating layer can be suppressed. As the insulating layer 407 or an insulating layer stacked over or under the insulating layer 407, a metal oxide layer including the same kind of component as the oxide semiconductor may be formed.

In this embodiment, a 200-nm-thick silicon oxide film is formed as the insulating layer 407 by a sputtering method. The substrate temperature in film formation may be higher than or equal to room temperature and lower than or equal to 300° C. and is 100° C. in this embodiment. The silicon oxide layer can be formed by a sputtering method in a rare gas (typically, argon) atmosphere, an oxygen atmosphere, or a mixed atmosphere containing a rare gas and oxygen. As a target, silicon oxide or silicon can be used. For example, the silicon oxide layer can be formed using silicon as a target in an atmosphere containing oxygen by a sputtering method.

In order to remove remaining moisture from the film formation chamber at the time of formation of the oxide semiconductor or the insulating layer 407, an entrapment vacuum pump (such as a cryopump) is preferably used. When the insulating layer 407 is formed in the film formation chamber evacuated using a cryopump, the impurity concentration in the insulating layer 407 can be reduced. In addition, as an evacuation unit for removing moisture remaining in the film formation chamber of the insulating layer 407, a turbo molecular pump provided with a cold trap may be used.

It is preferable that a high-purity gas from which impurities such as hydrogen, water, a hydroxyl group, or hydride are removed be used as a sputtering gas when the insulating layer 407 is formed.

Then, third heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). For example, the third heat treatment may be performed at 450° C. for one hour in a nitrogen atmosphere. In the third heat treatment, part of the oxide semiconductor layer (channel formation region) is heated in the state where it is in contact with the insulating layer 407. It is preferable that the above atmosphere do not contain water, hydrogen, or the like.

In the case where the heat treatment is performed in the state where the oxide semiconductor layer is in contact with the insulating layer 407 containing oxygen, oxygen can be further supplied to the oxide semiconductor layer from the insulating film 407 containing oxygen.

Through the above steps, the transistor 410 is formed. The transistor 410 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 410 is suppressed and the transistor 410 is electrically stable.

A protective insulating layer 409 may be formed over the insulating layer 407. For example, a silicon nitride layer is formed as the protective insulating layer 409 by a plasma CVD method, a sputtering method, or the like. An inorganic insulating material which hardly contains an impurity such as moisture and can prevent entry of the impurity from the outside, such as silicon nitride, aluminum nitride, or aluminum oxide is preferably used for the protective insulating layer 409. In this embodiment, the protective insulating layer 409 is formed using a silicon nitride layer (see FIG. 1E).

A silicon nitride layer used for the protective insulating layer 409 is formed in such a manner that the substrate 400 over which layers up to and including the insulating layer 407 are formed is heated to higher than or equal to 100° C. and lower than or equal to 400° C., a sputtering gas containing high-purity nitrogen from which hydrogen and moisture are removed is introduced, and a target of silicon is used. In this case, the protective insulating layer 409 is preferably formed while removing moisture remaining in the treatment chamber, in a manner similar to that of the insulating layer 407.

After the transistor 410 is formed, heat treatment may be further performed in the air at higher than or equal to 100° C. and lower than or equal to 200° C. for longer than or equal to 1 hour and shorter than or equal to 30 hours. This heat treatment may be performed at a fixed temperature. Alternatively, the following change in temperature is set as one cycle and may be repeated plural times: the temperature is increased from room temperature to a heating temperature and then decreased to room temperature.

Alternatively, without performing the first heat treatment, the second heat treatment may be performed under the condition of the first heat treatment. In that case, the second heat treatment is performed in a reduced pressure atmosphere, an inert gas atmosphere, or an oxygen gas atmosphere.

Figure 5A:
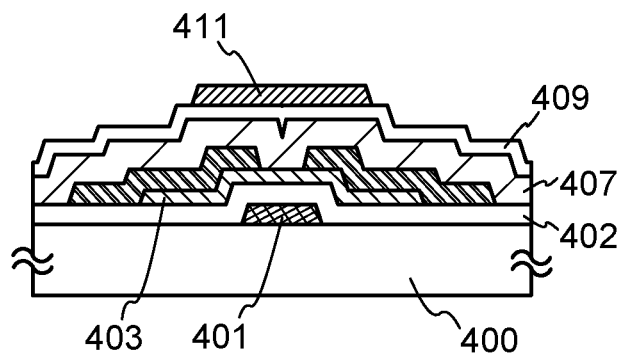
FIGS. 5A to 5D illustrate an embodiment of a semiconductor device and a method for manufacturing the semiconductor device.

An example in which a back gate electrode layer 411 is formed in the transistor 410 is illustrated in FIG. 5A. The back gate electrode layer 411 is positioned so that the channel formation region of the semiconductor layer is interposed between the gate electrode layer and the back gate electrode layer 411. The back gate electrode layer 411 is formed using a conductive layer and can function in a manner similar to that of the gate electrode layer. By changing a potential of the back gate electrode layer, the threshold voltage of the transistor can be changed.

The back gate electrode layer 411 can be formed using a material and a method similar to those of the gate electrode layer 401, the source electrode layer 405a, the drain electrode layer 405b, and the like.

In FIG. 5A, the back gate electrode layer 411 is formed over the channel formation region of the oxide semiconductor layer 403 with the insulating layer 407 and the protective insulating layer 409 provided therebetween. Although FIG. 5A illustrates the example in which the back gate electrode layer 411 is formed over the protective insulating layer 409, the back gate electrode layer 411 may be formed between the insulating layer 407 and the protective insulating layer 409.

The oxide semiconductor used for the semiconductor layer in this embodiment is an i-type (intrinsic) oxide semiconductor or a substantially i-type (intrinsic) oxide semiconductor. The i-type (intrinsic) oxide semiconductor or the substantially i-type (intrinsic) oxide semiconductor is obtained in such a manner that hydrogen, which serves as a donor, is removed from an oxide semiconductor as much as possible, and the oxide semiconductor is highly purified so as to contain as few impurities that are not a main component of the oxide semiconductor as possible. In other words, the oxide semiconductor has a feature in that it is made to be an i-type or made to be close thereto not by introduction of an impurity but by being highly purified by removal of an impurity such as hydrogen or water as much as possible. Accordingly, the oxide semiconductor layer used for the transistor is an oxide semiconductor layer which is highly purified and made to be electrically i-type.

In addition, it is possible that the highly purified oxide semiconductor includes extremely few carriers (close to zero), and the carrier concentration thereof is less than $1 \times 10^{14}/cm^3$, preferably less than $1 \times 10^{12}/cm^3$, more preferably less than $1 \times 10^{11}/cm^3$.

Since the oxide semiconductor includes extremely few carriers, the off-state current of the transistor can be reduced. The off-state current is preferably as small as possible.

Specifically, in a transistor including the above-described oxide semiconductor for a channel formation region, the off-state current per channel width of 1 μm at room temperature can be less than or equal to 10 aA ($1 \times 10^{-17}$ A/μm), further less than or equal to 1 aA ($1 \times 10^{-18}$ A/μm), still further less than or equal to 1 zA ($1 \times 10^{-21}$ A/μm), still further less than or equal to 1 yA ($1 \times 10^{-24}$ A/μm).

In addition, in the transistor including the above oxide semiconductor for the channel formation region, the temperature dependence of the on-state current is hardly observed, and the variation in the off-state current is extremely small.

A transistor including the above-described oxide semiconductor for a channel formation region is a transistor having high reliability in which the amount of change in threshold voltage of the transistor by the bias-temperature stress (BT) test can be reduced.

In the transistor including the above oxide semiconductor, relatively high field-effect mobility can be obtained, whereby high-speed operation is possible. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

As described above, a semiconductor device including an oxide semiconductor, which has stable electric characteristics, can be provided. Therefore, a semiconductor device with high reliability can be provided.

This embodiment can be implemented by being combined with other embodiments as appropriate.

[Embodiment 2]

In this embodiment, another embodiment of a semiconductor device and a method for manufacturing the semiconductor device will be described with reference to FIGS. 2A to 2E and FIG. 5B. Note that the same portions or portions having similar functions as in Embodiment 1 can be formed as in Embodiment 1, and the same steps or similar steps as in Embodiment 1 can be performed as in Embodiment 1; therefore, the description is not repeated in this embodiment. In addition, detailed description of the same portions is not repeated, either.

Figure 2A:
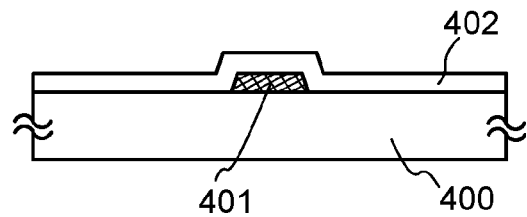
FIGS. 2A to 2E illustrate an embodiment of a semiconductor device and a method for manufacturing the semiconductor device.
Figure 2B:
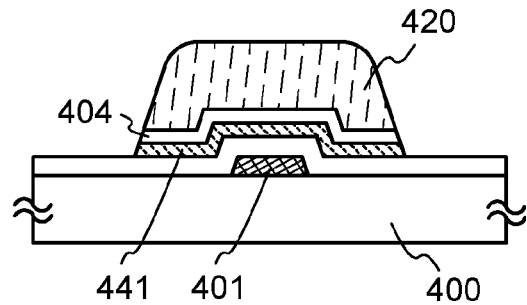
Figure 2C:
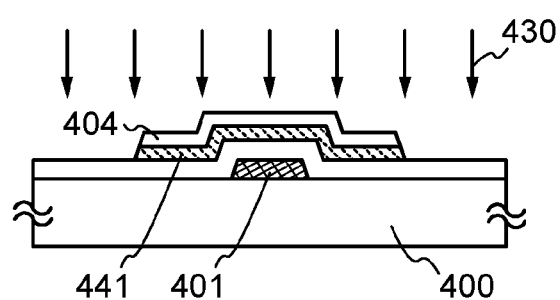
Figure 2D:
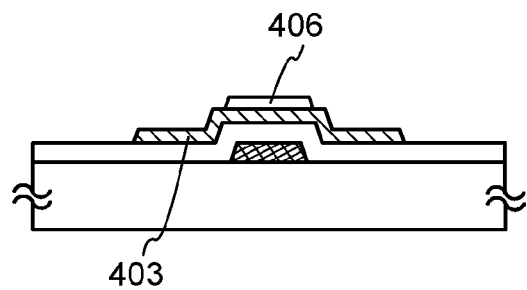
Figure 2E:
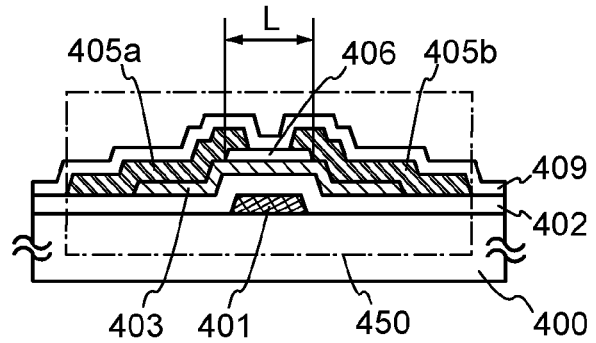

A transistor 450 illustrated in FIG. 2E includes, over a substrate 400, a gate electrode layer 401, a gate insulating layer 402, an oxide semiconductor layer 403, a channel protective layer 406, a source electrode layer 405a, and a drain electrode layer 405b. A protective insulating layer 409 is formed over the transistor 450. In addition, an insulating layer 407 may be provided as in the transistor 410. The transistor 450 has a kind of bottom-gate structure referred to as a channel-protective type (channel-stop type) and is also referred to as an inverted staggered transistor.

FIGS. 2A to 2E illustrate an example of a method for manufacturing the transistor 450.

First, the gate electrode layer 401 is formed over the substrate 400 through a first photolithography step. Then, the gate insulating layer 402 is formed over the gate electrode layer 401 (see FIG. 2A). A base layer may be provided between the substrate 400 and the gate electrode layer 401 as in Embodiment 1.

Next, over the gate insulating layer 402, an oxide semiconductor layer with a thickness of greater than or equal to 2 nm and less than or equal to 200 nm, preferably greater than or equal to 5 nm and less than or equal to 30 nm is formed. Then, a cap layer is formed over the oxide semiconductor layer.

As in Embodiment 1, before formation of the oxide semiconductor layer, chlorine or chlorine and oxygen may be introduced to the insulating layer over which the oxide semiconductor layer is formed.

The oxide semiconductor layer and the cap layer are preferably formed successively without exposing the interface between the oxide semiconductor layer and the cap layer to the air. By forming the oxide semiconductor layer and the cap layer successively without exposure to the air, impurities such as water, hydrogen, or hydrocarbon can be prevented from being attached to the interface between the oxide semiconductor layer and the cap layer.

In this embodiment, the oxide semiconductor layer is formed using an In—Ga—Zn—O-based oxide target by a sputtering method. The cap layer formed over the oxide semiconductor layer can be formed using a material and a method similar to those of the gate insulating layer 402. The cap layer formed over the oxide semiconductor layer preferably has a thickness of greater than or equal to 10 nm and less than or equal to 200 nm Note that a metal oxide including the same kind of component as the oxide semiconductor may be used for the cap layer. By using the metal oxide including the same kind of component as the oxide semiconductor for the cap layer, accumulation of hydrogen ions at the interface between the metal oxide and the oxide semiconductor and the vicinity thereof can be suppressed or prevented. Specifically, as the metal oxide, it is preferable to use a material including an oxide of one or more of metal elements that are constituent elements of the oxide semiconductor.

Gallium oxide is preferably used as the metal oxide. Since gallium oxide has a wide band gap (Eg), by providing gallium oxide layers with the oxide semiconductor layer provided therebetween, an energy barrier is formed at the interface between the oxide semiconductor layer and the metal oxide layer to prevent carrier transfer at the interface. Consequently, carriers are not transferred from the oxide semiconductor to the metal oxide, but are transferred mainly within the oxide semiconductor layer. On the other hand, hydrogen ions pass through the interface between the oxide semiconductor layer and the metal oxide layer and are accumulated in the vicinity of a surface of the metal oxide layer which is opposite to a surface in contact with the oxide semiconductor layer, for example. The above region is apart from a region where carriers flow, which results in no affect or a very slight affect on the threshold voltage of the transistor. When the gallium oxide is in contact with the In—Ga—Zn—O-based material, the energy barrier is about 0.8 eV on the conduction band side and about 0.9 eV on the valence band side.

Next, the oxide semiconductor layer is subjected to first heat treatment. The oxide semiconductor layer can be dehydrated or dehydrogenated by this first heat treatment. In addition, defects generated at the interface between the oxide semiconductor layer and the insulating layer in contact with the oxide semiconductor layer can be reduced. The first heat treatment can be performed by using a condition and a method similar to those in Embodiment 1.

Then, through a second photolithography step, the oxide semiconductor layer and the cap layer are processed into an island-shaped oxide semiconductor layer 441 and an island-shaped cap layer 404 (see FIG. 2B). Note that the etching of the oxide semiconductor layer and the cap layer may be performed using either dry etching or wet etching, or using both dry etching and wet etching. For example, the cap layer 404 may be formed by dry etching, and then, the oxide semiconductor layer 441 may be formed by wet etching.

Then, by performing ashing treatment in an oxygen atmosphere, a resist mask 420 formed over the cap layer 404 is decomposed and removed.

After the removal of the resist mask, oxygen 430 is introduced to the oxide semiconductor layer 441 through the cap layer 404. The introduction of the oxygen 430 can be performed by an ion implantation method or an ion doping method. Alternatively, the introduction of the oxygen 430 can be performed by the oxygen plasma doping described in Embodiment 1. By introducing the oxygen 430 to the oxide semiconductor layer 441 through the cap layer 404 stacked over the oxide semiconductor layer 441, excessive damage to the oxide semiconductor layer 441 through the introduction of the oxygen 430 can be reduced. Further, the oxygen introduction depth (introduction region) can be easily controlled, whereby oxygen can be efficiently introduced to the oxide semiconductor layer 441.

By using gallium oxide for the cap layer 404, charge buildup at the introduction of the oxygen 430 can be relieved, and excessive damage to the oxide semiconductor layer 441 can be further reduced.

When the step of removing the resist mask and the step of introducing the oxygen 430 to the oxide semiconductor layer 441 are successively performed in a reduced pressure atmosphere, an inert gas atmosphere, or an oxygen gas atmosphere without exposure to the air, impurities such as water, hydrogen, or hydrocarbon can be prevented from being attached to the surface of the cap layer 404 and from entering the oxide semiconductor due to ion impact at the introduction of the oxygen 430 (see FIG. 2C). It is preferable that the above atmosphere do not contain water, hydrogen, or the like.

In an ion implantation method, a source gas is made into plasma, ion species included in this plasma are extracted and mass-separated, and ion species with predetermined mass are accelerated and implanted into an object to be processed as an ion beam. In an ion doping method, a source gas is made into plasma, ion species are extracted from this plasma by an operation of a predetermined electric field, the extracted ion species are accelerated without mass separation and implanted into an object to be processed as an ion beam. When the introduction of oxygen is performed using an ion implantation method involving mass-separation, an impurity such as a metal element can be prevented from being introduced to the oxide semiconductor layer, together with oxygen. On the other hand, an ion doping method enables ion-beam irradiation to a larger area than an ion implantation method, and therefore, when the introduction of oxygen is performed using an ion doping method, the takt time can be shortened.

The oxygen introduction depth (introduction region) or the oxygen concentration can be controlled by appropriately setting introduction conditions such as the acceleration voltage and the dose or the thickness of the cap layer. For example, in the case where an oxygen gas is used and oxygen is introduced by an ion implantation method, the dose may be set to greater than or equal to $1 \times 10^{13}$ ions/cm$^2$ and less than or equal to $5 \times 10^{15}$ ions/cm$^2$. It is preferable that the peak of the concentration of the introduced oxygen in the oxide semiconductor layer 441 be greater than or equal to $1 \times 10^{18}$/cm$^3$ and less than or equal to $3 \times 10^{20}$/cm$^3$ (more preferably, greater than or equal to $1 \times 10^{18}$/cm$^3$ and less than or equal to $1 \times 10^{20}$/cm$^3$).

In particular, it is important to remove impurities such as hydrogen, water, a hydroxyl group, or hydride from the channel formation region of the oxide semiconductor layer. Therefore, the peak of the concentration of the oxygen which has been introduced is preferably positioned in the oxide semiconductor layer 441 around the interface between the oxide semiconductor layer 441 and the gate insulating layer 402.

Next, second heat treatment is performed on the oxide semiconductor layer 441. The step of introducing oxygen to the oxide semiconductor layer 441 and the second heat treatment are preferably performed successively in a reduced pressure atmosphere, an inert gas atmosphere, or an oxygen gas atmosphere without exposure to the air. The oxide semiconductor layer 441 can be dehydrated or dehydrogenated by the second heat treatment. In addition, defects generated at the interface between the oxide semiconductor layer and the insulating layer in contact with the oxide semiconductor layer can be reduced. The second heat treatment can be performed by using a condition and a method similar to those in Embodiment 1.

By the introduction of oxygen and the heat treatment, the oxide semiconductor layer can be dehydrated or dehydrogenated, whereby impurities such as hydrogen, moisture, a hydroxyl group, or hydride can be removed from the oxide semiconductor layer. As a result, the oxide semiconductor layer 441 can be the oxide semiconductor layer 403 which is highly purified and made electrically i-type.

Instead of the second heat treatment, heat treatment may be performed on the substrate provided with the oxide semiconductor layer 441 at a temperature of higher than or equal to 250° C. and lower than or equal to 700° C. (or a temperature of lower than or equal to the strain point of a glass substrate) while the introduction of the oxygen 430 to the oxide semiconductor layer 441 is performed.

Then, the cap layer 404 is processed through a third photolithography step, so that the channel protective layer 406 covering the channel formation region of the oxide semiconductor layer 403 is formed. Note that during the step of processing the cap layer 404, part of the oxide semiconductor layer 403 is removed in some cases depending on the processing conditions. In this case, the thickness of a region of the oxide semiconductor layer 403 which is not covered with the channel protective layer 406 becomes small.

Note that the channel length L of the transistor 450 is determined by the width of the channel protective layer 406 in contact with the oxide semiconductor layer 403 in a direction parallel with a carrier flow direction (see FIG. 2E).

Next, after a conductive layer is formed over the oxide semiconductor layer 403 and the channel protective layer 406, the source electrode layer 405a and the drain electrode layer 405b are formed through a fourth photolithography step. The source electrode layer 405a and the drain electrode layer 405b can be formed by using a material and a method similar to those of the source electrode layer 405a and the drain electrode layer 405b described in Embodiment 1.

Through the above process, the transistor 450 is formed. The transistor 450 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 450 is suppressed and the transistor 450 is electrically stable.

The protective insulating layer 409 which prevents entry of impurities such as moisture or hydrogen from the outside is preferably formed over the channel protective layer 406, the source electrode layer 405a, and the drain electrode layer 405b so that these impurities do not enter the oxide semiconductor layer 403 (see FIG. 2E). The protective insulating layer 409 can be formed in a manner similar to that in Embodiment 1.

In addition, a gallium oxide film may be formed as the protective insulating layer 409 or an insulating layer stacked over or under the protective insulating layer 409. Gallium oxide is a material which is hardly charged; therefore, variation in the threshold voltage due to charge buildup of the insulating layer can be suppressed.

After the transistor 450 is formed, heat treatment may be further performed in the air at a temperature of higher than or equal to 100° C. and lower than or equal to 200° C. for longer than or equal to 1 hour and shorter than or equal to 30 hours. This heat treatment may be performed at a fixed temperature. Alternatively, the following change in temperature is set as one cycle and may be repeated plural times: the temperature is increased from room temperature to a heating temperature and then decreased to room temperature.

Alternatively, without performing the first heat treatment, the second heat treatment may be performed under the condition of the first heat treatment. In that case, the second heat treatment is performed in a reduced pressure atmosphere, an inert gas atmosphere, or an oxygen gas atmosphere.

Figure 5B:
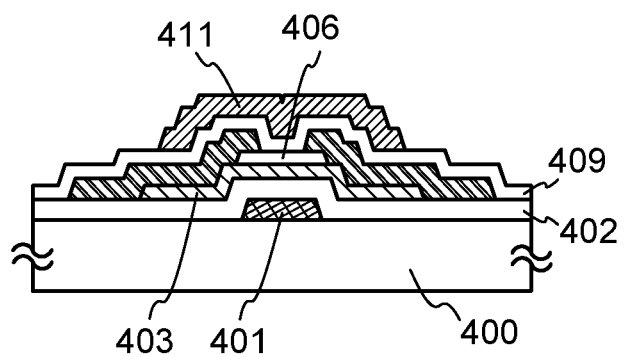

An example in which a back gate electrode layer 411 is formed in the transistor 450 is illustrated in FIG. 5B. The back gate electrode layer 411 is formed over the channel formation region of the oxide semiconductor layer 403 with the protective insulating layer 409 provided therebetween. Although FIG. 5B illustrates the example in which the back gate electrode layer 411 is formed over the protective insulating layer 409, the back gate electrode layer 411 may be formed over the channel protective layer 406 by using the same layer as the source electrode layer 405a and the drain electrode layer 405b. By changing a potential of the back gate electrode layer 411, the threshold voltage of the transistor can be changed.

In addition, in the transistor including the oxide semiconductor for the channel formation region, the temperature dependence of the on-state current is hardly observed, and the variations in the off-state current are extremely small.

A transistor including the above-described oxide semiconductor for a channel formation region is a transistor having high reliability in which the amount of change in threshold voltage of the transistor by the bias-temperature stress (BT) test can be reduced.

In the transistor including the oxide semiconductor, relatively high field-effect mobility can be obtained, whereby high-speed operation is possible. Consequently, when the above transistor is used in a pixel portion of a semiconductor device having a display function, high-quality images can be obtained. In addition, since a driver circuit portion and the pixel portion can be formed over one substrate, the number of components of the semiconductor device can be reduced.

As described above, a semiconductor device including an oxide semiconductor, which has stable electric characteristics, can be provided. Therefore, a semiconductor device with high reliability can be provided.

This embodiment can be implemented by being combined with other embodiments as appropriate.

[Embodiment 3]

In this embodiment, another embodiment of a semiconductor device and a method for manufacturing the semiconductor device will be described with reference to FIGS. 3A to 3E and FIG. 5C. Note that the same portions or portions having similar functions as in the above embodiment can be formed as in the above embodiment, and the same steps or similar steps as in the above embodiment can be performed as in the above embodiment; therefore, the description is not repeated in this embodiment. In addition, detailed description of the same portions is not repeated, either.

Figure 3A:
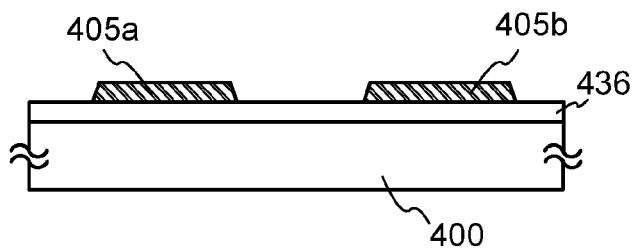
FIGS. 3A to 3E illustrate an embodiment of a semiconductor device and a method for manufacturing the semiconductor device.
Figure 3B:
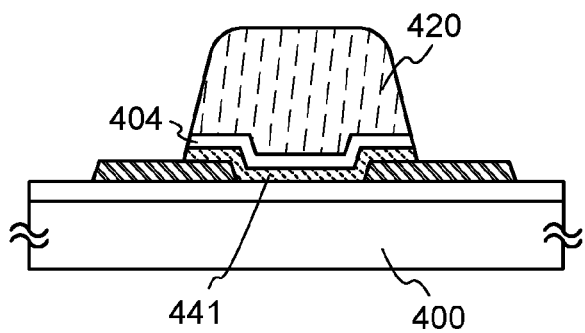
Figure 3C:
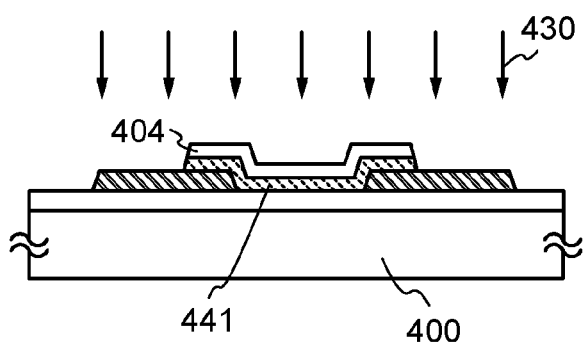
Figure 3D:
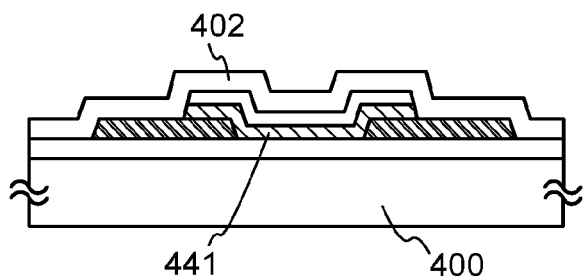
Figure 3E:
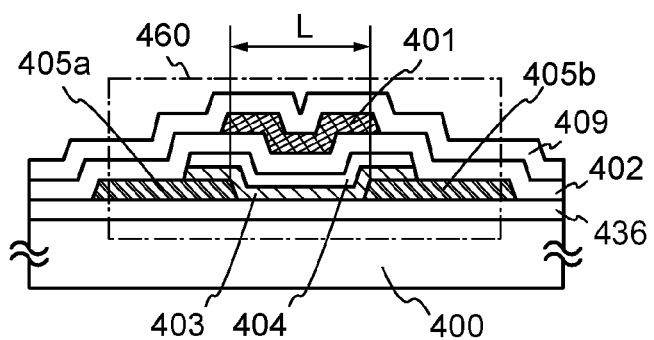

A transistor 460 illustrated in FIG. 3E includes, over a substrate 400, a source electrode layer 405a, a drain electrode layer 405b, an oxide semiconductor layer 403, a gate insulating layer 402, and a gate electrode layer 401. A base layer 436 is formed between the substrate 400 and the oxide semiconductor layer 403. A protective insulating layer 409 is provided over the transistor 460. A cap layer 404 is formed over the oxide semiconductor layer 403. The cap layer 404 also functions as a gate insulating layer. The transistor 460 is referred to as a staggered transistor which is one of top-gate structures.

FIGS. 3A to 3E illustrate an example of a method for manufacturing the transistor 460.

First, the base layer 436 is formed over the substrate 400. The base layer 436 can be formed in a manner similar to that of the base layer described in Embodiment 1. By using a metal oxide including the same kind of component as the oxide semiconductor for the base layer 436, accumulation of hydrogen ions at the interface between the metal oxide and the oxide semiconductor and the vicinity thereof can be suppressed or prevented. Specifically, as the metal oxide, it is preferable to use a material including an oxide of one or more of metal elements that are constituent elements of the oxide semiconductor.

Next, after a conductive layer is formed over the base layer 436, the source electrode layer 405a and the drain electrode layer 405b are formed through a first photolithography step. The source electrode layer 405a and the drain electrode layer 405b can be formed by using a material and a method similar to those of the source electrode layer 405a and the drain electrode layer 405b described in Embodiment 1 (see FIG. 3A).

Light exposure at the time of the formation of the resist mask in the first photolithography step may be performed using ultraviolet light, KrF laser light, or ArF laser light. The channel length L of the transistor 460 is determined by the distance between the source electrode layer 405a and the drain electrode layer 405b which are in contact with the oxide semiconductor layer 403 (see FIG. 3E). In the case where light exposure is performed for a channel length L of less than 25 nm, the light exposure at the time of the formation of the resist mask in the third photolithography step may be performed using extreme ultraviolet light having an extremely short wavelength of greater than or equal to several nanometers and less than or equal to several tens of nanometers. In the light exposure by using extreme ultraviolet light, the resolution is high and the focus depth is large. Therefore, the channel length L of the transistor to be formed later can be greater than or equal to 10 nm and less than or equal to 1000 nm, whereby operation speed of a circuit can be increased.

Next, over the base layer 436, the source electrode layer 405a, and the drain electrode layer 405b, an oxide semiconductor layer with a thickness of greater than or equal to 2 nm and less than or equal to 200 nm, preferably greater than or equal to 5 nm and less than or equal to 30 nm is formed. Then, a cap layer is formed over the oxide semiconductor layer. The oxide semiconductor layer and the cap layer are preferably formed successively without exposing the interface between the oxide semiconductor layer and the cap layer to the air. By forming the oxide semiconductor layer and the cap layer successively without exposure to the air, impurities such as water, hydrogen, or hydrocarbon can be prevented from being attached to the interface between the oxide semiconductor layer and the cap layer.

As in Embodiment 1, before formation of the oxide semiconductor layer, chlorine or chlorine and oxygen may be introduced to the insulating layer (corresponding to the base layer 436 in this embodiment) over which the oxide semiconductor layer is formed. The introduction of chlorine or chlorine and oxygen may be performed before formation of the source electrode layer 405a and the drain electrode layer 405b as long as it is before the formation of the oxide semiconductor layer.

In this embodiment, the oxide semiconductor layer is formed using an In—Ga—Zn—O-based oxide target by a sputtering method. The cap layer formed over the oxide semiconductor layer can be formed using a material and a method similar to those in Embodiment 2.

Next, the oxide semiconductor layer is subjected to first heat treatment. The oxide semiconductor layer can be dehydrated or dehydrogenated by the first heat treatment. In addition, defects generated at the interface between the oxide semiconductor layer and the insulating layer in contact with the oxide semiconductor layer can be reduced. The first heat treatment can be performed by using a condition and a method similar to those in Embodiment 1.

Then, through a second photolithography step, the oxide semiconductor layer and the cap layer are processed in to an island-shaped oxide semiconductor layer 441 and an island-shaped cap layer 404 (see FIG. 3B). Note that the etching of the oxide semiconductor layer and the cap layer may be performed using either dry etching or wet etching, or using both dry etching and wet etching. For example, the cap layer 404 may be formed by dry etching, and then, the oxide semiconductor layer 441 may be formed by wet etching.

Then, by performing ashing treatment in an oxygen atmosphere, a resist mask 420 formed over the cap layer 404 is decomposed and removed.

After the removal of the resist mask, oxygen 430 is introduced to the oxide semiconductor layer 441 through the cap layer 404. The introduction of the oxygen 430 can be performed by an ion implantation method or an ion doping method. Alternatively, the introduction of the oxygen 430 can be performed by the oxygen plasma doping described in Embodiment 1. By introducing the oxygen 430 to the oxide semiconductor layer 441 through the cap layer 404 stacked over the oxide semiconductor layer 441, excessive damage to the oxide semiconductor layer 441 through the introduction of the oxygen 430 can be reduced. Further, the oxygen introduction depth (introduction region) can be easily controlled, whereby oxygen can be efficiently introduced to the oxide semiconductor layer 441.

By using gallium oxide for the cap layer 404, charge buildup at the introduction of the oxygen 430 can be relieved, and excessive damage to the oxide semiconductor layer 441 can be further reduced.

When the step of removing the resist mask and the step of introducing the oxygen 430 to the oxide semiconductor layer 441 are successively performed in a reduced pressure atmosphere, an inert gas atmosphere, or an oxygen gas atmosphere without exposure to the air, impurities such as water, hydrogen, or hydrocarbon can be prevented from being attached to the surface of the oxide semiconductor layer 441, whereby entry of the impurities into the oxide semiconductor layer due to ion impact at the introduction of the oxygen 430 can be prevented (see FIG. 3C).

In order to simplify the process, as described in Embodiment 1, the oxygen 430 may be introduced to the oxide semiconductor layer 441 without providing the cap layer 404, but it is preferable to provide the cap layer 404 for the above reason.

When the oxygen 430 is introduced by an ion implantation method or an ion doping method, the oxygen introduction depth (introduction region) or the oxygen concentration can be controlled by appropriately setting introduction conditions such as the acceleration voltage and the dose. For example, in the case where an oxygen gas is used and oxygen is introduced by an ion implantation method, the dose may be set to greater than or equal to $1 \times 10^{13}$ ions/cm$^2$ and less than or equal to $5 \times 10^{15}$ ions/cm$^2$. It is preferable that the peak of the concentration of the introduced oxygen in the oxide semiconductor layer 441 be greater than or equal to $1 \times 10^{18}$/cm$^3$ and less than or equal to $3 \times 10^{20}$/cm$^3$ (more preferably, greater than or equal to $1 \times 10^{18}$/cm$^3$ and less than or equal to $1 \times 10^{20}$/cm$^3$).

In particular, it is important to remove impurities such as hydrogen, water, a hydroxyl group, or hydride from a channel formation region of the oxide semiconductor layer, so that in the transistor 460 having a top-gate structure, a large amount of oxygen is preferably introduced to the vicinity of the interface between the cap layer 404 and the oxide semiconductor layer 441 in the oxide semiconductor layer 441.

Next, second heat treatment is performed on the oxide semiconductor layer 441. The step of introducing oxygen to the oxide semiconductor layer 441 and the second heat treatment are preferably performed successively in a reduced pressure atmosphere, an inert gas atmosphere, or an oxygen gas atmosphere without exposure to the air. The oxide semiconductor layer 441 can be dehydrated or dehydrogenated by the second heat treatment. In addition, defects generated at the interface between the oxide semiconductor layer and the insulating layer in contact with the oxide semiconductor layer can be reduced. The second heat treatment can be performed in a condition similar to that of Embodiment 1.

By the introduction of oxygen and the heat treatment, the oxide semiconductor layer can be dehydrated or dehydrogenated, whereby impurities such as hydrogen, moisture, a hydroxyl group, or hydride can be removed from the oxide semiconductor layer. As a result, the oxide semiconductor layer 403 which is highly purified and made electrically i-type can be obtained.

Instead of the second heat treatment, heat treatment may be performed on the substrate provided with the oxide semiconductor layer 441 at a temperature of higher than or equal to 250° C. and lower than or equal to 700° C. (or a temperature of lower than or equal to the strain point of a glass substrate) while the introduction of the oxygen 430 to the oxide semiconductor layer 441 is performed.

Then, the gate insulating layer 402 is formed. The cap layer 404 may be removed before formation of the gate insulating layer 402. The gate insulating layer 402 can be formed using a material and a method which are similar to those of the gate insulating layer 402 in Embodiment 1.

Then, a conductive layer is formed over the gate insulating layer 402, and then, the gate electrode layer 401 is formed through a third photolithography step. The gate electrode layer 401 can be formed in a manner similar to that of the gate electrode layer 401 described in Embodiment 1.

Through the above-described steps, the transistor 460 is manufactured. The transistor 460 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 460 is suppressed and the transistor 460 is electrically stable.

The protective insulating layer 409 which prevents entry of impurities such as moisture or hydrogen from the outside is preferably formed over the gate electrode layer 401 and the gate insulating layer 402 so that these impurities do not enter the oxide semiconductor layer 403 (see FIG. 3E). The protective insulating layer 409 can be formed in a manner similar to that in Embodiment 1.

In addition, a gallium oxide layer may be formed as the protective insulating layer 409 or an insulating layer stacked over or under the protective insulating layer 409. Gallium oxide is a material which is hardly charged; therefore, variation in the threshold voltage due to charge buildup of the insulating layer can be suppressed.

After the transistor 460 is formed, heat treatment may be further performed in the air at a temperature of higher than or equal to 100° C. and lower than or equal to 200° C. for longer than or equal to 1 hour and shorter than or equal to 30 hours. This heat treatment may be performed at a fixed temperature. Alternatively, the following change in temperature is set as one cycle and may be repeated plural times: the temperature is increased from room temperature to a heating temperature and then decreased to room temperature.

Alternatively, without performing the first heat treatment, the second heat treatment may be performed under the condition of the first heat treatment. In that case, the second heat treatment is performed in a reduced pressure atmosphere, an inert gas atmosphere, or an oxygen gas atmosphere.

Figure 5C:
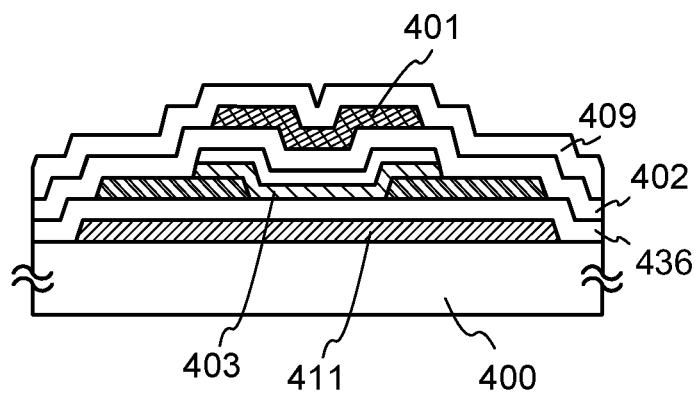

An example in which a back gate electrode layer 411 is formed in the transistor 460 is illustrated in FIG. 5C. The back gate electrode layer 411 is formed in a region overlapping with the channel formation region of the oxide semiconductor layer 403 with the base layer 436 provided therebetween. By changing a potential of the back gate electrode layer 411, the threshold voltage of the transistor can be changed.

In addition, in the transistor including the oxide semiconductor for the channel formation region, the temperature dependence of the on-state current is hardly observed, and the variations in the off-state current are extremely small.

A transistor including the above-described oxide semiconductor for a channel formation region is a transistor having high reliability in which the amount of change in threshold voltage of the transistor by the bias-temperature stress (BT) test can be reduced.

In the transistor including the oxide semiconductor, relatively high field-effect mobility can be obtained, whereby high-speed operation is possible. Consequently, when the above transistor is used in a pixel portion of a semiconductor device having a display function, high-quality images can be obtained. In addition, since a driver circuit portion and the pixel portion can be formed over one substrate, the number of components of the semiconductor device can be reduced.

As described above, a semiconductor device including an oxide semiconductor, which has stable electric characteristics, can be provided. Therefore, a semiconductor device with high reliability can be provided.

This embodiment can be implemented by being combined with other embodiments as appropriate.

[Embodiment 4]

In this embodiment, another embodiment of a semiconductor device and a method for manufacturing the semiconductor device will be described with reference to FIGS. 4A to 4E and FIG. 5D. Note that the same portions or portions having similar functions as in the above embodiment can be formed as in the above embodiment, and the same steps or similar steps as in the above embodiment can be performed as in the above embodiment; therefore, the description is not repeated in this embodiment. In addition, detailed description of the same portions is not repeated, either.

Figure 4A:
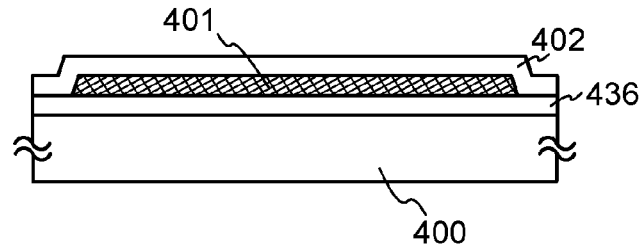
FIGS. 4A to 4E illustrate an embodiment of a semiconductor device and a method for manufacturing the semiconductor device.
Figure 4B:
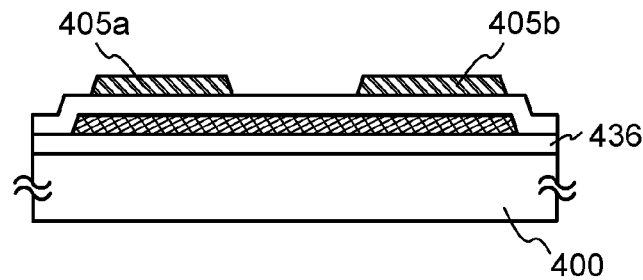
Figure 4C:
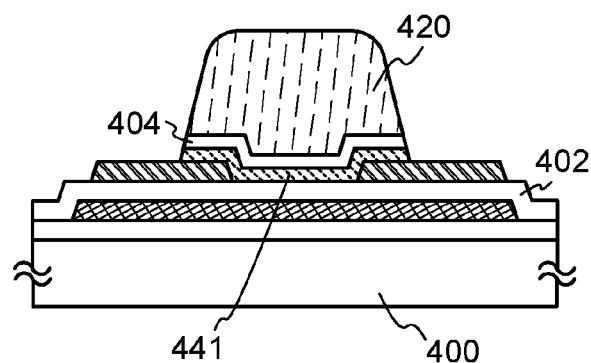
Figure 4D:
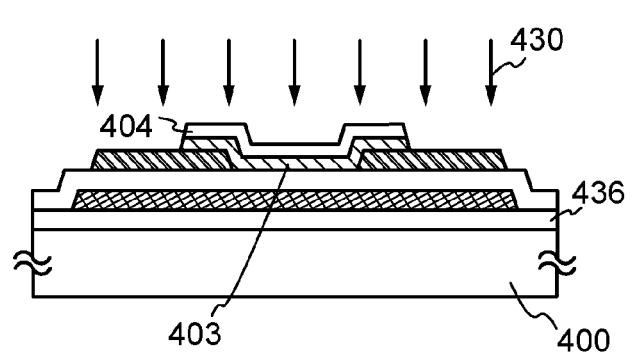
Figure 4E:
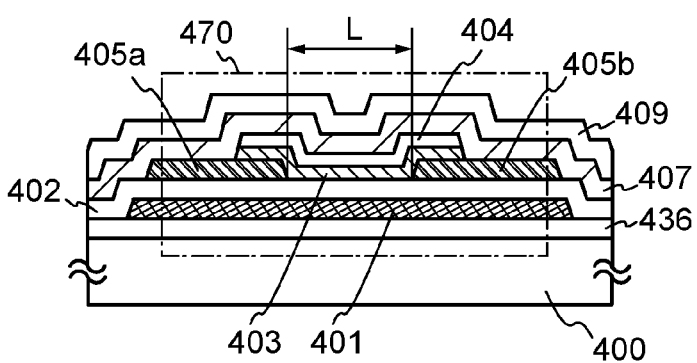

A transistor 470 illustrated in FIG. 4E includes, over a substrate 400 having an insulating surface, a gate electrode layer 401, a gate insulating layer 402, an oxide semiconductor layer 403, a source electrode layer 405a, and a drain electrode layer 405b. An insulating layer 407 and a protective insulating layer 409 are stacked over the transistor 470 in this order. A cap layer 404 is formed over the oxide semiconductor layer 403. The transistor 470 is one of bottom-gate transistors.

FIGS. 4A to 4E illustrate an example of a method for manufacturing the transistor 470.

First, the gate electrode layer 401 is formed over the substrate 400 through a first photolithography step. Then, the gate insulating layer 402 is formed over the gate electrode layer 401 (see FIG. 4A). A base layer may be provided between the substrate 400 and the gate electrode layer 401 as in Embodiment 1.

Next, a conductive layer is formed over the gate insulating layer 402, and then, a second photolithography step is performed to form the source electrode layer 405a and the drain electrode layer 405b. The source electrode layer 405a and the drain electrode layer 405b can be formed by using a material and a method similar to those of the source electrode layer 405a and the drain electrode layer 405b described in Embodiment 1 (see FIG. 4B). The channel length L of the transistor 470 is determined by the distance between the source electrode layer 405a and the drain electrode layer 405b which are in contact with the oxide semiconductor layer 403 formed later (see FIG. 4E).

Next, over the gate insulating layer 402, the source electrode layer 405a, and the drain electrode layer 405b, an oxide semiconductor layer with a thickness of greater than or equal to 2 nm and less than or equal to 200 nm, preferably greater than or equal to 5 nm and less than or equal to 30 nm is formed. Then, a cap layer is formed over the oxide semiconductor layer. The oxide semiconductor layer and the cap layer are preferably formed successively without exposing the interface between the oxide semiconductor layer and the cap layer to the air. By forming the oxide semiconductor layer and the cap layer successively without exposure to the air, impurities such as water, hydrogen, or hydrocarbon can be prevented from being attached to the interface between the oxide semiconductor layer and the cap layer.

As in Embodiment 1, before formation of the oxide semiconductor layer, chlorine or chlorine and oxygen may be introduced to the insulating layer over which the oxide semiconductor layer is formed. The introduction of chlorine or chlorine and oxygen may be performed before formation of the source electrode layer 405a and the drain electrode layer 405b as long as it is before the formation of the oxide semiconductor layer.

In this embodiment, the oxide semiconductor layer is formed using an In—Ga—Zn—O-based oxide target by a sputtering method. The cap layer formed over the oxide semiconductor layer can be formed using a material and a method similar to those in Embodiment 2.

Next, the oxide semiconductor layer is subjected to first heat treatment. The oxide semiconductor layer can be dehydrated or dehydrogenated by this first heat treatment. In addition, defects generated at the interface between the oxide semiconductor layer and the insulating layer in contact with the oxide semiconductor layer can be reduced. The first heat treatment can be performed by using a condition and a method similar to those in Embodiment 1.

Then, through a third photolithography step, the oxide semiconductor layer and the cap layer are processed in to an island-shaped oxide semiconductor layer 441 and an island-shaped cap layer 404 (see FIG. 4C). Note that the etching of the oxide semiconductor layer and the cap layer may be performed using either dry etching or wet etching, or using both dry etching and wet etching. For example, the cap layer 404 may be formed by dry etching, and then, the oxide semiconductor layer 441 may be formed by wet etching.

Then, by performing ashing treatment in an oxygen atmosphere, a resist mask 420 formed over the cap layer 404 is decomposed and removed.

After the removal of the resist mask 420, oxygen 430 is introduced to the oxide semiconductor layer 441 through the cap layer 404. The introduction of the oxygen 430 can be performed by an ion implantation method or an ion doping method described in Embodiment 2. Alternatively, the introduction of the oxygen 430 can be performed by the oxygen plasma doping described in Embodiment 1. By introducing the oxygen 430 to the oxide semiconductor layer 441 through the cap layer 404 stacked over the oxide semiconductor layer 441, excessive damage to the oxide semiconductor layer 441 through the introduction of the oxygen 430 can be reduced. Further, the oxygen introduction depth (introduction region) can be easily controlled, whereby oxygen can be efficiently introduced to the oxide semiconductor layer 441.

By using gallium oxide for the cap layer 404, charge buildup at the introduction of the oxygen 430 can be relieved, and excessive damage to the oxide semiconductor layer 441 can be further reduced.

When the step of removing the resist mask and the step of introducing the oxygen 430 to the oxide semiconductor layer 441 are successively performed in a reduced pressure atmosphere, an inert gas atmosphere, or an oxygen gas atmosphere without exposure to the air, impurities such as water, hydrogen, or hydrocarbon can be prevented from being attached to the surface of the oxide semiconductor layer 441, whereby entry of the impurities into the oxide semiconductor due to ion impact at the introduction of the oxygen 430 can be prevented (see FIG. 4D).

In order to simplify the process, as described in Embodiment 1, the oxygen 430 may be introduced to the oxide semiconductor layer 441 without providing the cap layer 404, but it is preferable to provide the cap layer 404 for the above reason.

Next, second heat treatment is performed on the oxide semiconductor layer 441. The step of introducing oxygen to the oxide semiconductor layer 441 and the second heat treatment are preferably performed successively in a reduced pressure atmosphere, an inert gas atmosphere, or an oxygen gas atmosphere without exposure to the air. The oxide semiconductor layer 441 can be dehydrated or dehydrogenated by the second heat treatment. In addition, defects generated at the interface between the oxide semiconductor layer and the insulating layer in contact with the oxide semiconductor layer can be reduced. The second heat treatment can be performed by using a condition similar to that in Embodiment 1.

By the introduction of oxygen and the heat treatment, the oxide semiconductor layer can be dehydrated or dehydrogenated, whereby impurities such as hydrogen, moisture, a hydroxyl group, or hydride can be removed from the oxide semiconductor layer. As a result, the oxide semiconductor layer 403 which is highly purified and made electrically i-type can be obtained.

Instead of the second heat treatment, heat treatment may be performed on the substrate provided with the oxide semiconductor layer 441 at a temperature of higher than or equal to 250° C. and lower than or equal to 700° C. (or a temperature of lower than or equal to the strain point of a glass substrate) while the introduction of the oxygen 430 to the oxide semiconductor layer 441 is performed.

Then, the insulating layer 407 is formed over the cap layer 404, the source electrode layer 405a, and the drain electrode layer 405b. Before formation of the insulating layer 407, plasma treatment with the use of a gas such as $N_2O$, $N_2$, or Ar may be performed to remove water or the like adsorbed on the surfaces of the cap layer 404, the source electrode layer 405a, and the drain electrode layer 405b. When the plasma treatment is performed, the insulating layer 407 is formed successively without exposure to the air (see FIG. 4E). The insulating layer 407 can be formed by using a condition and a method similar to those in Embodiment 1.

Then, third heat treatment may be performed in a reduced pressure atmosphere, an inert gas atmosphere, an oxygen gas atmosphere, or an ultra-dry air atmosphere (preferably at a temperature of higher than or equal to 200° C. and lower than or equal to 600° C., for example, a temperature of higher than or equal to 250° C. and lower than or equal to 550° C.). For example, the third heat treatment may be performed at 450° C. for one hour in a nitrogen atmosphere. In the third heat treatment, part of the oxide semiconductor layer (channel formation region) is heated in the state where it is in contact with the insulating layer 407.

Through the above steps, oxygen which is one of main components of the oxide semiconductor and which is reduced together with impurities such as hydrogen, moisture, a hydroxyl group, or hydride (also referred to as a hydrogen compound) through the second heat treatment performed on the oxide semiconductor layer can be supplied.

Through the above process, the transistor 470 is formed. The transistor 470 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 470 is suppressed and the transistor 470 is electrically stable.

The protective insulating layer 409 may be formed over the insulating layer 407. For example, a silicon nitride layer is formed as the protective insulating layer 409 by a plasma CVD method, a sputtering method, or the like. The protective insulating layer 409 can be formed by using a condition and a method similar to those in Embodiment 1 (see FIG. 4E).

After the transistor 410 is formed, heat treatment may be further performed in the air at a temperature of higher than or equal to 100° C. and lower than or equal to 200° C. for longer than or equal to 1 hour and shorter than or equal to 30 hours. This heat treatment may be performed at a fixed temperature. Alternatively, the following change in temperature is set as one cycle and may be repeated plural times: the temperature is increased from room temperature to a heating temperature and then decreased to room temperature.

Alternatively, without performing the first heat treatment, the second heat treatment may be performed under the condition of the first heat treatment. In that case, the second heat treatment is performed in a reduced pressure atmosphere, an inert gas atmosphere, or an oxygen gas atmosphere.

Figure 5D:
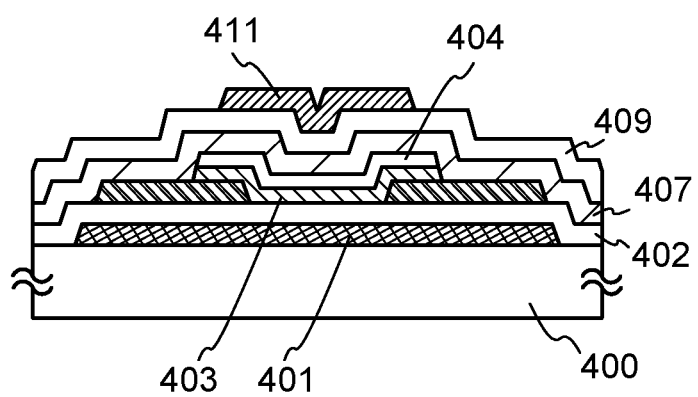

An example in which a back gate electrode layer 411 is formed over the transistor 470 is illustrated in FIG. 5D. The back gate electrode layer 411 is positioned so that the channel formation region of the semiconductor layer is interposed between the gate electrode layer and the back gate electrode layer 411. The back gate electrode layer 411 is formed using a conductive layer and is made to function in a manner similar to that of the gate electrode layer. By changing a potential of the back gate electrode layer 411, the threshold voltage of the transistor can be changed.

The back gate electrode layer 411 can be formed using a material and a method similar to those of the gate electrode layer 401, the source electrode layer 405a, and the drain electrode layer 405b.

In FIG. 5D, the back gate electrode layer 411 is formed over the channel formation region of the oxide semiconductor layer 403 with the insulating layer 407 and the protective insulating layer 409 provided therebetween. Although FIG. 5D illustrates the example in which the back gate electrode layer 411 is formed over the protective insulating layer 409, the back gate electrode layer 411 may be formed between the insulating layer 407 and the protective insulating layer 409.

In addition, in the transistor including the oxide semiconductor for the channel formation region, the temperature dependence of the on-state current is hardly observed, and the variations in the off-state current are extremely small.

A transistor including the above-described oxide semiconductor for a channel formation region is a transistor having high reliability in which the amount of change in threshold voltage of the transistor by the bias-temperature stress (BT) test can be reduced.

In the transistor including the oxide semiconductor, relatively high field-effect mobility can be obtained, whereby high-speed operation is possible. Consequently, when the above transistor is used in a pixel portion of a semiconductor device having a display function, high-quality images can be obtained. In addition, since a driver circuit portion and the pixel portion can be formed over one substrate, the number of components of the semiconductor device can be reduced.

As described above, a semiconductor device including an oxide semiconductor, which has stable electric characteristics, can be provided. Therefore, a semiconductor device with high reliability can be provided.

This embodiment can be implemented by being combined with other embodiments as appropriate.

[Embodiment 5]

Figure 8:
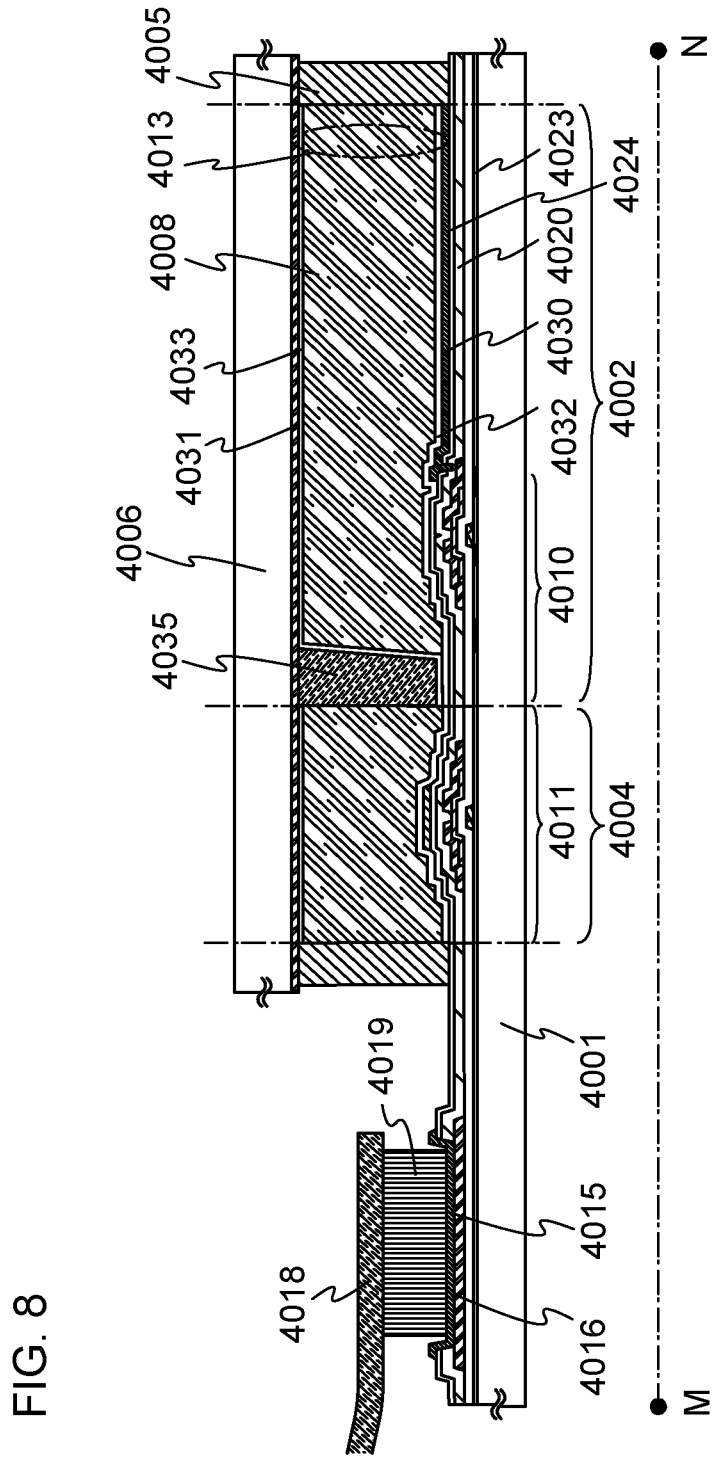
FIG. 8 illustrates an embodiment of a semiconductor device.
Figure 9:
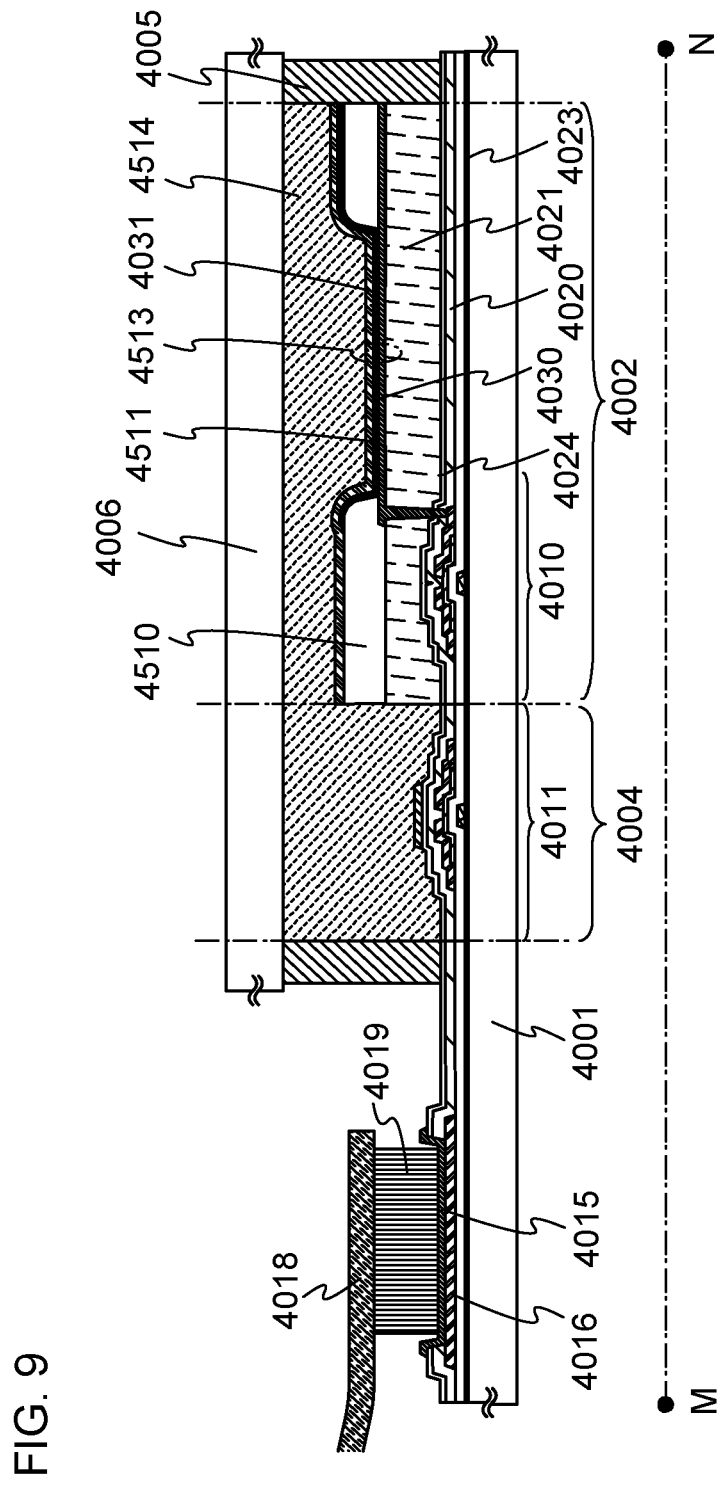
FIG. 9 illustrates an embodiment of a semiconductor device.
Figure 10:
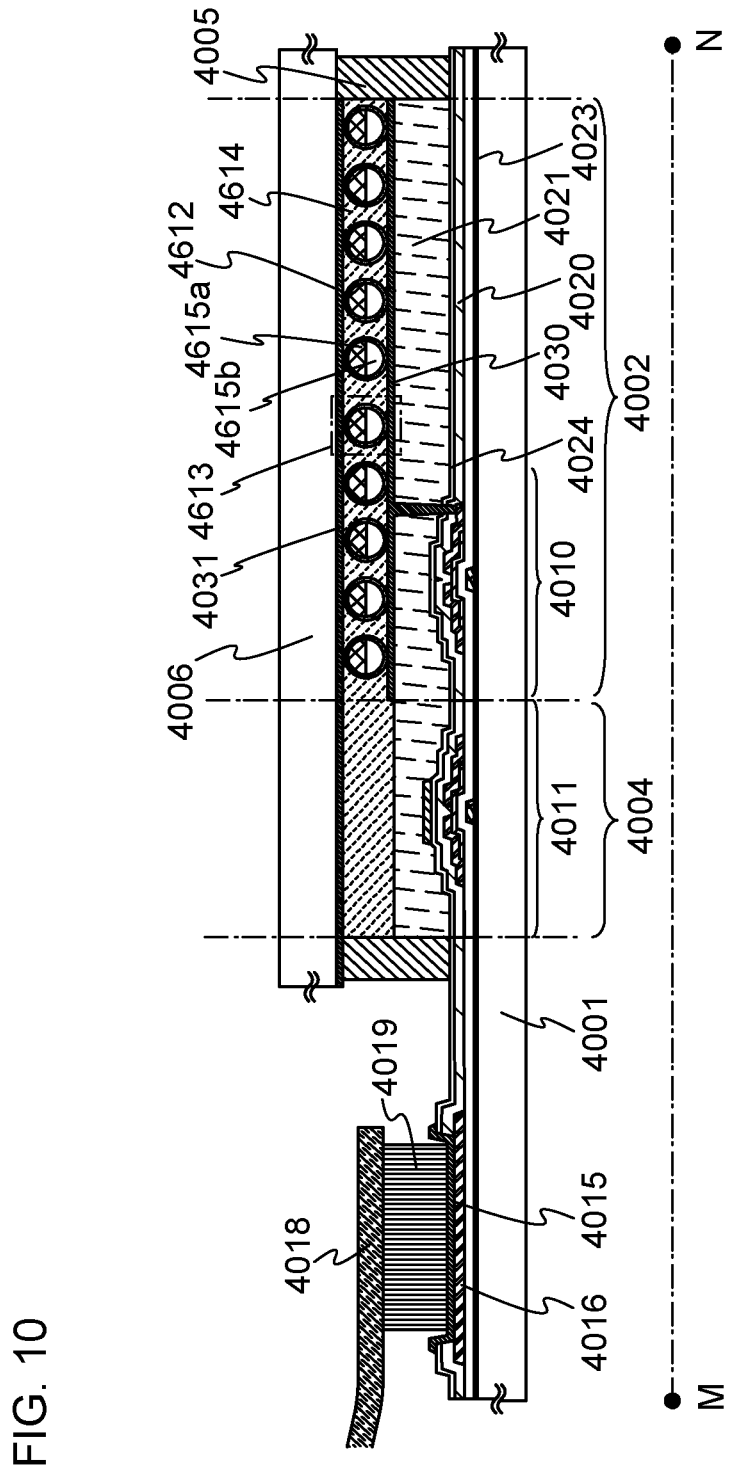
FIG. 10 illustrates an embodiment of a semiconductor device.

A semiconductor device with a display function (also referred to as a display device) can be manufactured by using the transistor whose example is described in any of the above embodiments. In addition, part of or entire driver circuit which includes the transistor can be formed over a substrate where a pixel portion is formed, whereby a system-on-panel can be obtained. In this embodiment, an example of a display device including the transistor whose example is described in any of the above embodiments will be described with reference to FIGS. 7A to 7C, FIG. 8, FIG. 9, and FIG. 10. FIG. 8, FIG. 9, and FIG. 10 correspond to cross-sectional views along line M-N in FIG. 7B.

Figure 7A:
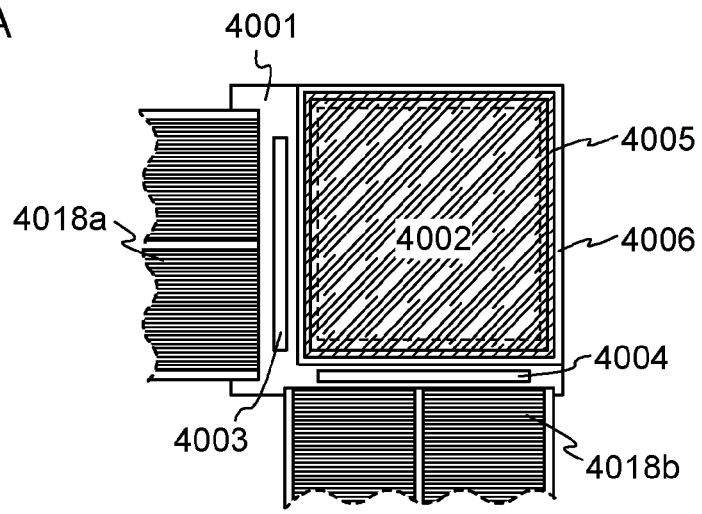
FIGS. 7A to 7C each illustrate an embodiment of a semiconductor device.

In FIG. 7A, a sealant 4005 is provided so as to surround a pixel portion 4002 provided over a first substrate 4001, and the pixel portion 4002 is sealed by using a second substrate 4006. In FIG. 7A, a scan line driver circuit 4004 and a signal line driver circuit 4003 are each formed using a single crystal semiconductor or a polycrystalline semiconductor over a substrate prepared separately, and mounted in a region different from the region surrounded by the sealant 4005 over the first substrate 4001. Further, a variety of signals and potentials are supplied to the signal line driver circuit 4003, the scan line driver circuit 4004, and the pixel portion 4002 from flexible printed circuits (FPCs) 4018a and 4018b.

Figure 7B:
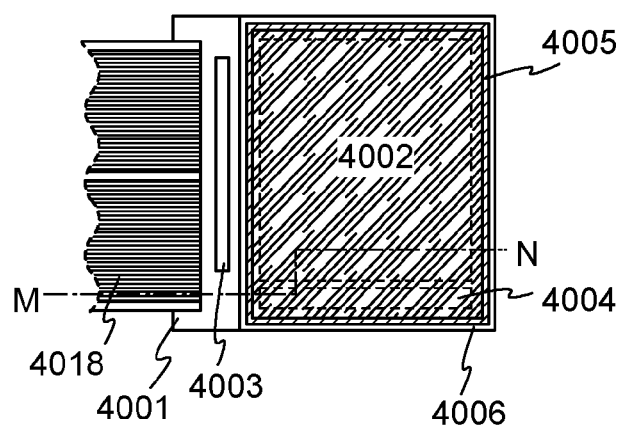
Figure 7C:
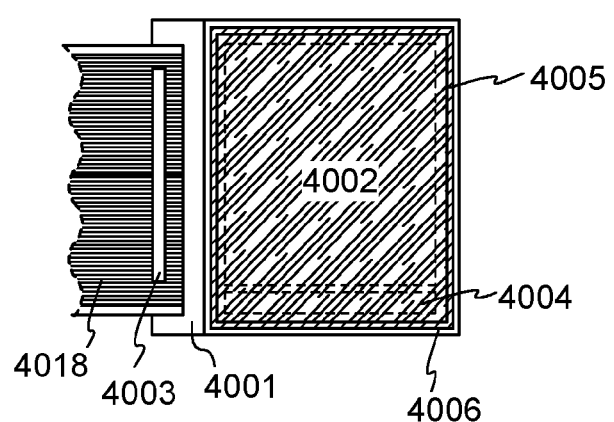

In FIGS. 7B and 7C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 7B and 7C, the signal line driver circuit 4003 which is formed using a single crystal semiconductor or a polycrystalline semiconductor over a substrate separately prepared is mounted in a region that is different from the region surrounded by the sealant 4005 over the first substrate 4001. In FIGS. 7B and 7C, a variety of signals and potentials are supplied to the signal line driver circuit 4003, the scan line driver circuit 4004, and the pixel portion 4002 from an FPC 4018.

Although FIGS. 7B and 7C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 7A illustrates the example in which the signal line driver circuit 4003 and the scan line driver circuit 4004 are mounted by a COG method. FIG. 7B illustrates the example in which the signal line driver circuit 4003 is mounted by a COG method. FIG. 7C illustrates the example in which the signal line driver circuit 4003 is mounted by a TAB method.

The display device includes in its category a panel in which a display element is sealed, and a module in which an IC including a controller or the like is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate each include a plurality of transistors, to which the transistor whose example is described in any of the above embodiments can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

As illustrated in FIG. 8, FIG. 9, and FIG. 10, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4030, and the terminal electrode 4016 is formed from the same conductive layer as a source electrode layer and a drain electrode layer of transistors 4010 and 4011.

Each of the pixel portion 4002 and the scan line driver circuit 4004 which are provided over the first substrate 4001 includes a plurality of transistors. In FIG. 8, FIG. 9, and FIG. 10, the transistor 4010 included in the pixel portion 4002 and the transistor 4011 included in the scan line driver circuit 4004 are illustrated as an example. In FIG. 8, an insulating layer 4020 and an insulating layer 4024 are provided over the transistors 4010 and 4011, and in FIG. 9 and FIG. 10, an insulating layer 4021 is further provided. Note that an insulating layer 4023 is an insulating layer serving as a base layer.

In this embodiment, the transistor described in any of the above embodiments can be applied to the transistors 4010 and 4011.

In the transistors 4010 and 4011, the oxide semiconductor layer is an oxide semiconductor layer which is highly purified and from which impurities such as hydrogen, moisture, a hydroxyl group, or hydride (also referred to as a hydrogen compound) are intentionally removed by introducing oxygen through the insulating layer 4020 stacked over the oxide semiconductor layer and performing heat treatment. By introduction of oxygen, a bond between a metal included in the oxide semiconductor and hydrogen or a bond between the metal and a hydroxyl group is cut, and the hydrogen or the hydroxyl group is reacted with oxygen to produce water; this leads to easy elimination of the hydrogen or the hydroxyl group that is an impurity as water by heat treatment performed later.

Oxygen is introduced to the oxide semiconductor layer through the insulating layer 4020 stacked over the oxide semiconductor layer, so that the oxygen introduction depth (introduction region) can be controlled and thus oxygen can be efficiently introduced to the oxide semiconductor layer.

The oxide semiconductor layer and the insulating layer 4020 containing oxygen are in contact with each other when being subjected to the heat treatment; thus, oxygen, which is one of the main components of the oxide semiconductor and is reduced in the step of removing impurities, can be supplied from the insulating layer 4020 containing oxygen to the oxide semiconductor layer. Thus, the oxide semiconductor layer is more highly purified to become electrically i-type (intrinsic).

Consequently, variation in the electric characteristics of the transistors 4010 and 4011 each including the highly purified oxide semiconductor layer is suppressed and the transistors 4010 and 4011 are electrically stable. As described above, a semiconductor device with high reliability can be provided as the semiconductor devices illustrated in FIG. 8, FIG. 9, and FIG. 10.

In this embodiment, examples are shown in which a conductive layer is provided over the insulating layer so as to overlap with a channel formation region of the oxide semiconductor layer of the transistor 4011 for the driver circuit. The conductive layer is provided so as to overlap with the channel formation region of the oxide semiconductor layer, whereby the amount of change in the threshold voltage of the transistor 4011 before and after a BT test can be further reduced. The conductive layer may have the same potential as or a potential different from that of a gate electrode layer of the transistor 4011, and can function as a second gate electrode layer. The potential of the conductive layer may be GND, 0V, or in a floating state.

In addition, the conductive layer functions to block an external electric field, that is, to prevent an external electric field (particularly, to prevent static electricity) from effecting the inside (a circuit portion including a thin film transistor). A blocking function of the conductive layer can prevent variation in the electrical characteristics of the transistor due to the effect of an external electric field such as static electricity.

The transistor 4010 included in the pixel portion 4002 is electrically connected to a display element to form a display panel. There is no particular limitation on the kind of the display element as long as display can be performed, and various kinds of display elements can be employed.

An example of a liquid crystal display device using a liquid crystal element as a display element is illustrated in FIG. 8. In FIG. 8, a liquid crystal element 4013 which is a display element includes the first electrode layer 4030, a second electrode layer 4031, and a liquid crystal layer 4008. Note that insulating layers 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral agent has a short response time of less than or equal to 1 msec, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor that includes an oxide semiconductor layer has a possibility that the electric characteristics may fluctuate significantly by the influence of static electricity and deviate from the designed range. Therefore, it is more effective to use a liquid crystal material exhibiting a blue phase for a liquid crystal display device including a transistor which includes an oxide semiconductor layer.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including a high-purity oxide semiconductor layer, it is enough to provide a storage capacitor having a capacitance that is less than or equal to ⅓, preferably less than or equal to ⅕ of a liquid crystal capacitance of each pixel.

In the transistor used in this embodiment, which includes a highly purified oxide semiconductor layer, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In a transistor including the oxide semiconductor, relatively high field-effect mobility can be obtained, whereby high-speed operation is possible. Consequently, when the above transistor is used in a pixel portion of a semiconductor device having a display function, high-quality images can be obtained. In addition, since a driver circuit portion and the pixel portion can be formed over one substrate, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally-black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element is described as a light-emitting element.

In order to extract light emitted from the light-emitting element, at least one of a pair of electrodes may be transparent. A transistor and a light-emitting element are formed over a substrate. The light-emitting element can have any of the following structures: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device including a light-emitting element as a display element is illustrated in FIG. 9. A light-emitting element 4513 which is a display element is electrically connected to the transistor 4010 provided in the pixel portion 4002. The structure of the light-emitting element 4513 is not limited to the stacked-layer structure including the first electrode layer 4030, an electroluminescent layer 4511, and the second electrode layer 4031, which is illustrated in FIG. 9. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective layer may be formed over the second electrode layer 4031 and the partition wall 4510 in order to prevent entry of oxygen, hydrogen, moisture, carbon dioxide, or the like into the light-emitting element 4513. As the protective layer, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so that the device is not exposed to the outside air, in this manner.

As the filler 4514, as well as an inert gas such as nitrogen or argon, an ultraviolet curable resin or a thermosetting resin can be used, and polyvinyl chloride (PVC), an acrylic resin, polyimide, an epoxy resin, a silicone resin, polyvinyl butyral (PVB), ethylene vinyl acetate (EVA), or the like can be used. For example, nitrogen may be used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, a polarizing plate or a circularly polarizing plate may be provided with an anti-reflection layer. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device includes a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 10 illustrates an active matrix electronic paper as an embodiment of a semiconductor device. The electronic paper in FIG. 10 is an example of a display device in which a twisting ball display system is employed.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 8, FIG. 9, and FIG. 10, as the first substrate 4001 and the second substrate 4006, flexible substrates, for example, plastic substrates having a light-transmitting property or the like can be used, in addition to glass substrates. As plastic, a fiberglass-reinforced plastic (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4020 can be formed using a material including an inorganic insulating material such as silicon oxide, silicon oxynitride, hafnium oxide, aluminum oxide, or gallium oxide. There is no particular limitation on the method for forming the insulating layer 4020, and for example, the insulating layer 4020 can be formed by a deposition method such as a plasma CVD method or a sputtering method. A sputtering method is appropriate in terms of low possibility of entry of hydrogen, water, and the like.

Note that the insulating layer 4024 prevents contaminant impurities such as an organic substance, a metal, or water vapor included in the air from entering; thus, a dense film is preferably used for the insulating layer 4024. The insulating layer 4024 can be formed with a single-layer structure or a stacked-layer structure using one or more of a silicon nitride film, a silicon nitride oxide film, an aluminum oxide film, an aluminum nitride film, an aluminum oxynitride film, and an aluminum nitride oxide film by a sputtering method. The insulating layer 4024 functions as a protective film of the transistor.

The insulating layer 4021 which functions as a planarizing insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of any of these materials.

There is no particular limitation on the method for forming the insulating layer 4020, the insulating layer 4024, and the insulating layer 4021, and the insulating layers can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium zinc oxide, ITO, or ITO to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), silver (Ag), and magnesium (Mg); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called t-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

Since the transistor is easily broken owing to static electricity or the like, a protective circuit for protecting the driver circuit is preferably provided. The protective circuit is preferably formed using a nonlinear element.

As described above, by using any of the transistors described in the above embodiments, a semiconductor device having a variety of functions can be provided.

[Embodiment 6]

By using the transistor whose example is described in any of the above embodiments, a semiconductor device having an image sensor function for reading data of an object can be manufactured.

Figure 11A:
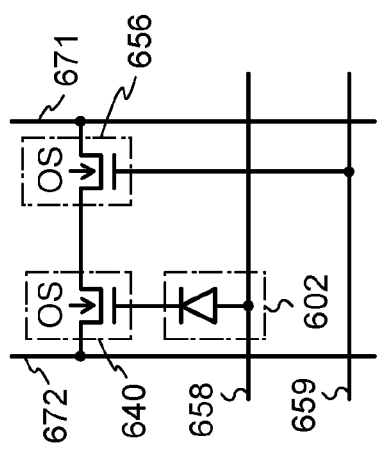
FIGS. 11A and 11B illustrate an embodiment of a semiconductor device.
Figure 11B:
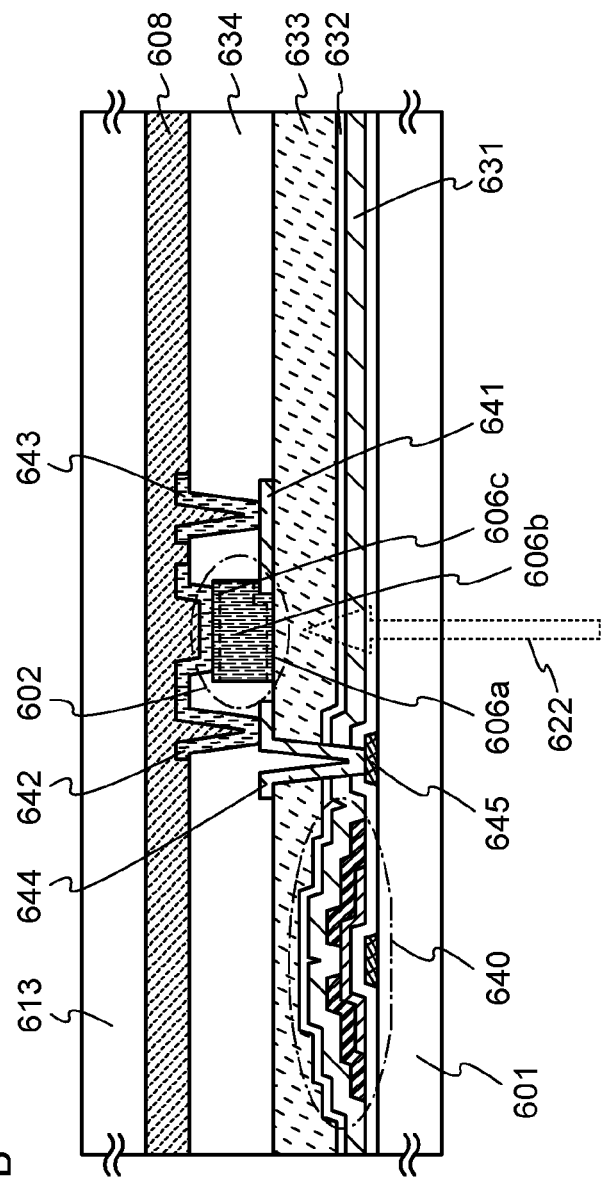

FIGS. 11A and 11B illustrate an example of a semiconductor device having an image sensor function. FIG. 11A is an equivalent circuit diagram of a photosensor, and FIG. 11B is a cross-sectional view of part of the photosensor.

In FIG. 11A, one electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor including an oxide semiconductor layer is denoted by a symbol "OS" so that it can be identified as a transistor including an oxide semiconductor layer. In FIG. 11A, the transistor 640 and the transistor 656 are transistors including an oxide semiconductor layer.

FIG. 11B is a cross-sectional view of the photodiode 602 and the transistor 640 in the photosensor. The photodiode 602 functioning as a sensor and the transistor 640 are provided over a substrate 601. A substrate 613 is provided over the photodiode 602 and the transistor 640 with an adhesive layer 608 interposed therebetween.

An insulating layer 631, a protective insulating layer 632, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are stacked in that order over the interlayer insulating layer 633. The first semiconductor layer 606a is electrically connected to an electrode layer 641 which is provided over the interlayer insulating layer 633, and the third semiconductor layer 606c is electrically connected to an electrode layer 642 which is provided over the interlayer insulating layer 634.

The electrode layer 641 is electrically connected to a conductive layer 643 which is formed in the interlayer insulating layer 634, and the electrode layer 642 is electrically connected to a gate electrode layer 645 through an electrode layer 644. The gate electrode layer 645 is electrically connected to a gate electrode layer of the transistor 640, that is, the photodiode 602 is electrically connected to the transistor 640.

Here, a pin photodiode in which a semiconductor layer having a p-type conductivity as the first semiconductor layer 606a, a high-resistance semiconductor layer (i-type semiconductor layer) as the second semiconductor layer 606b, and a semiconductor layer having an n-type conductivity as the third semiconductor layer 606c are stacked is illustrated as an example.

The first semiconductor layer 606a is a p-type semiconductor layer and can be formed using an amorphous silicon film containing an impurity element imparting p-type conductivity. The first semiconductor layer 606a is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be employed. The first semiconductor layer 606a is preferably formed to have a thickness of greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor deposition method, a sputtering method, or the like. The second semiconductor layer 606b is preferably formed to have a thickness of greater than or equal to 200 nm and less than or equal to 1000 nm. Ideally, an intrinsic semiconductor layer refers to a semiconductor layer which does not contain an impurity and whose Fermi level is positioned substantially in the center of a forbidden band; however, the second semiconductor layer 606b may be formed using a semiconductor into which an impurity serving as a donor (e.g., phosphorus (P) or the like) or an impurity serving as an acceptor (e.g., boron (B) or the like) is added in order that the Fermi level is positioned substantially in the center of the forbidden band.

The third semiconductor layer 606c is an n-type semiconductor layer and is formed using an amorphous silicon film containing an impurity element imparting n-type conductivity. The third semiconductor layer 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be employed. The third semiconductor layer 606c is preferably formed to have a thickness of greater than or equal to 20 nm and less than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor, a microcrystalline semiconductor, or a semi-amorphous semiconductor (SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

This microcrystalline semiconductor can be formed by a radio-frequency plasma CVD method with a frequency of greater than or equal to several tens of megahertz and less than or equal to several hundreds of megahertz, or a microwave plasma CVD apparatus with a frequency of greater than or equal to 1 GHz. Typically, the microcrystalline semiconductor can be formed using silicon hydride such as $SiH_4$, $Si_2H_6$, $SiH_2Cl_2$, $SiHCl_3$, $SiCl_4$, or $SiF_4$, which is diluted with hydrogen. With a dilution with one or plural kinds of rare gas elements selected from helium, argon, krypton, and neon in addition to silicon hydride and hydrogen, the microcrystalline semiconductor can be formed.

In the dilution of silicon hydride, the flow ratio of hydrogen to silicon hydride is set to 5:1 to 200:1, preferably, 50:1 to 150:1, more preferably, 100:1. Further, a carbide gas such as $CH_4$ or $C_2H_6$, a germanium gas such as $GeH_4$ or $GeF_4$, $F_2$, or the like may be mixed into a gas containing silicon.

In addition, since the mobility of holes generated by the photoelectric effect is lower than that of electrons, a pin photodiode has better characteristics when a surface on the p-type semiconductor layer side is used as a light-receiving surface. Here, an example in which light 622 received by the photodiode 602 from a surface of the substrate 601, over which the pin photodiode is formed, is converted into electric signals will be described. Light from the semiconductor layer side having a conductivity type opposite to that of the semiconductor layer side on the light-receiving surface is disturbance light; therefore, the electrode layer is preferably formed from a light-blocking conductive layer. Note that a surface of the n-type semiconductor layer side can alternatively be used as the light-receiving surface.

The insulating layer 631, the protective insulating layer 632, the interlayer insulating layer 633, and the interlayer insulating layer 634 can be formed using an insulating material by a sputtering method, a spin coating method, a dipping method, spray coating, a droplet discharge method (e.g., an ink-jet method, screen printing, or offset printing), roll coating, curtain coating, knife coating, or the like depending on the material.

As the insulating layer 631, a single layer or a stacked-layer of an oxide insulating layer such as a silicon oxide layer, a silicon oxynitride layer, an aluminum oxide layer, an aluminum oxynitride layer, or the like can be used.

As an inorganic insulating material of the protective insulating layer 632, a single layer or a stacked-layer of a nitride insulating layer such as a silicon nitride layer, a silicon nitride oxide layer, an aluminum nitride layer, an aluminum nitride oxide layer, or the like can be used. High-density plasma CVD with the use of microwaves (2.45 GHz) is preferably employed since formation of a dense and high-quality insulating layer having high withstand voltage is possible.

For reduction of the surface roughness, an insulating layer functioning as a planarizing insulating layer is preferably used as the interlayer insulating layers 633 and 634. The interlayer insulating layers 633 and 634 can be formed using an organic material having heat resistance such as an acrylic resin, polyimide, a benzocyclobutene-based resin, polyamide, or an epoxy resin. In addition to such organic materials, it is possible to use a single layer or a stacked layer of a low-dielectric constant material (a low-k material), a siloxane-based resin, phosphosilicate glass (PSG), borophosphosilicate glass (BPSG), and the like.

When the light 622 that enters the photodiode 602 is detected, data on an object to be detected can be read. Note that a light source such as a backlight can be used at the time of reading data on an object to be detected.

A transistor described as an example in the above embodiment can be used as the transistor 640. A transistor including an oxide semiconductor layer that is highly purified by intentionally eliminating impurities such as hydrogen, moisture, a hydroxyl group, or hydride (also referred to as a hydrogen compound) has a suppressed variation in the electric characteristics and is electrically stable. Therefore, a semiconductor device with high reliability can be provided.

This embodiment can be implemented in appropriate combination with the structure described in any of other embodiments.

[Embodiment 7]

In this embodiment, examples of electronic devices each including the display device described in the above embodiment will be described.

Figure 12A:
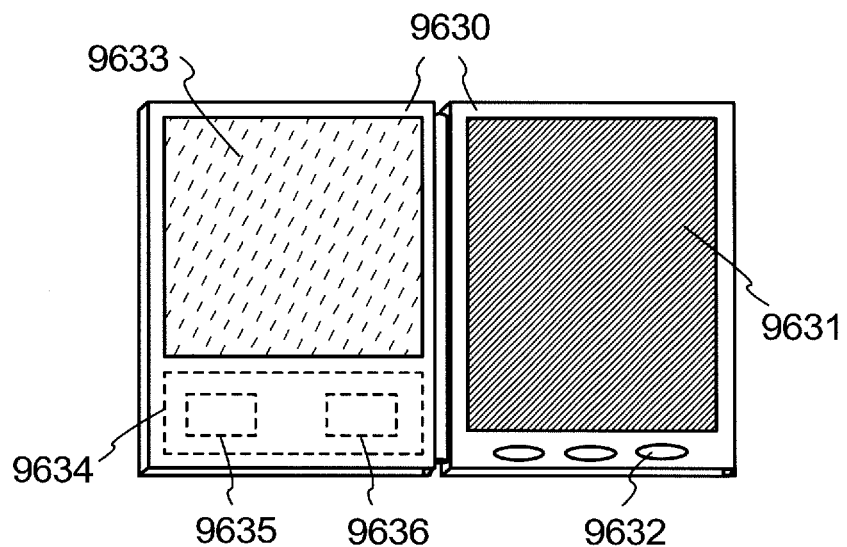
FIGS. 12A and 12B illustrate an electronic device.

FIG. 12A illustrates an electronic book reader (also referred to as an e-book reader) which can include housings 9630, a display portion 9631, operation keys 9632, a solar battery 9633, and a charge and discharge control circuit 9634. The electronic book reader is provided with the solar battery 9633 and a display panel so that the solar battery 9633 and the display panel can be opened and closed freely. In the electronic book reader, power from the solar battery is supplied to the display panel or a video signal processing portion. The electronic book reader illustrated in FIG. 12A can have a function of displaying various kinds of data (e.g., a still image, a moving image, and a text image) on the display portion, a function of displaying a calendar, a date, the time, or the like on the display portion, a touch-input function of operating or editing the data displayed on the display portion by touch input, a function of controlling processing by various kinds of software (programs), and the like. Note that in FIG. 12A, a structure including a battery 9635 and a DCDC converter (hereinafter abbreviated as a converter 9636) is illustrated as an example of the charge and discharge control circuit 9634.

The display portion 9631 is a reflective liquid crystal display device having a touch-input function with the use of photo sensors and is used in a comparatively bright environment. Therefore, the structure illustrated in FIG. 12A is preferable because power generation by the solar battery 9633 and charge in the battery 9635 can be performed efficiently. Note that a structure in which the solar battery 9633 is provided on each of a surface and a rear surface of the housing 9630 is preferable in order to charge the battery 9635 efficiently. When a lithium ion battery is used as the battery 9635, there is an advantage of downsizing or the like.

Figure 12B:
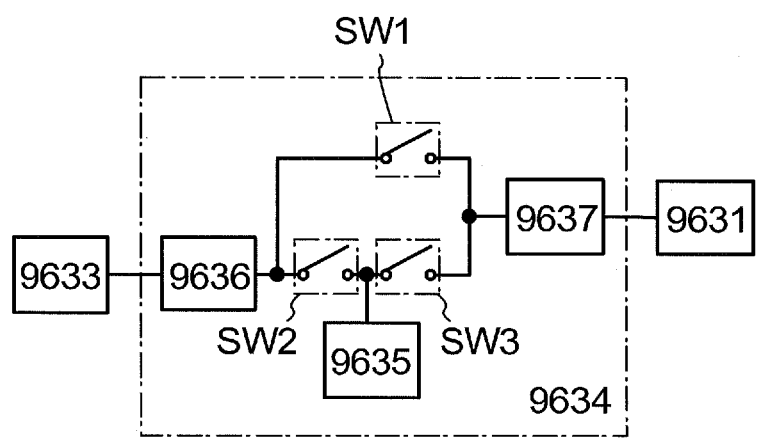

The structure and the operation of the charge and discharge control circuit 9634 illustrated in FIG. 12A are described with reference to a block diagram in FIG. 12B. The solar battery 9633, the battery 9635, the converter 9636, a converter 9637, switches SW1 to SW3, and the display portion 9631 are illustrated in FIG. 12B, and the battery 9635, the converter 9636, the converter 9637, and the switches SW1 to SW3 correspond to the charge and discharge control circuit 9634.

First, an example of the operation in the case where power is generated by the solar battery 9633 using external light is described. The voltage of power generated by the solar battery is raised or lowered by the converter 9636 so that the power has a voltage for charging the battery 9635. Then, when the power from the solar battery 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Note that although the solar battery 9633 is described as an example of a means for charge, charge of the battery 9635 may be performed with another means. In addition, a combination of the solar battery 9633 and another means for charge may be used.

Figure 13A:
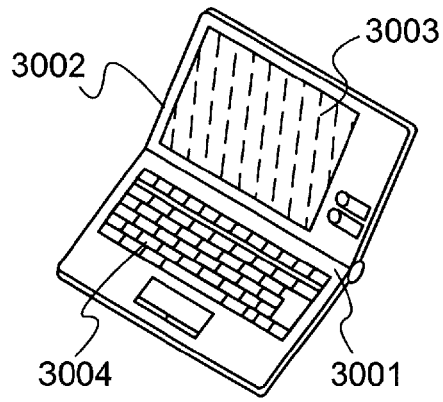
FIGS. 13A to 13F each illustrate an electronic device.

FIG. 13A illustrates a laptop personal computer, which includes a main body 3001, a housing 3002, a display portion 3003, a keyboard 3004, and the like. By using the semiconductor device described in any of the above embodiments, a highly reliable laptop personal computer can be obtained.

Figure 13B:
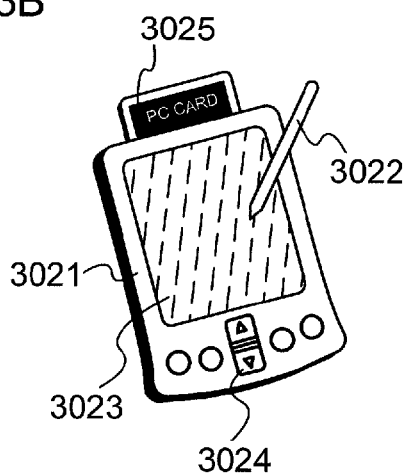

FIG. 13B is a personal digital assistant (PDA) including a display portion 3023, an external interface 3025, an operation button 3024, and the like in a main body 3021. A stylus 3022 is included as an accessory for operation. By using the semiconductor device described in any of the above embodiments, a highly reliable personal digital assistant (PDA) can be obtained.

Figure 13C:
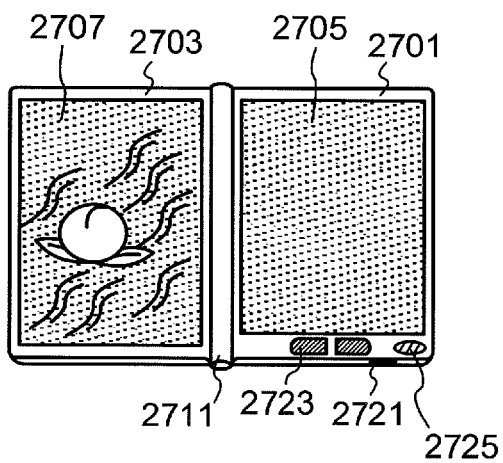

FIG. 13C illustrates an example of an electronic book reader. For example, the electronic book reader includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 13C) can display text and a display portion on the left side (the display portion 2707 in FIG. 13C) can display images. By using the semiconductor device described in any of the above embodiments, a highly reliable electronic book reader can be obtained.

FIG. 13C illustrates an example in which the housing 2701 includes an operation portion and the like. For example, the housing 2701 is provided with a power supply terminal 2721, operation keys 2723, a speaker 2725, and the like. With the operation key 2723, pages can be turned. Note that a keyboard, a pointing device, or the like may also be provided on the surface of the housing, where the display portion is provided. Furthermore, an external connection terminal (an earphone terminal, a USB terminal, or the like), a recording medium insertion portion, and the like may be provided on the rear surface or the side surface of the housing. Further, the electronic book reader may have a function of an electronic dictionary.

The electronic book reader may transmit and receive data wirelessly. Through wireless communication, desired book data or the like can be purchased and downloaded from an electronic book server.

Figure 13D:
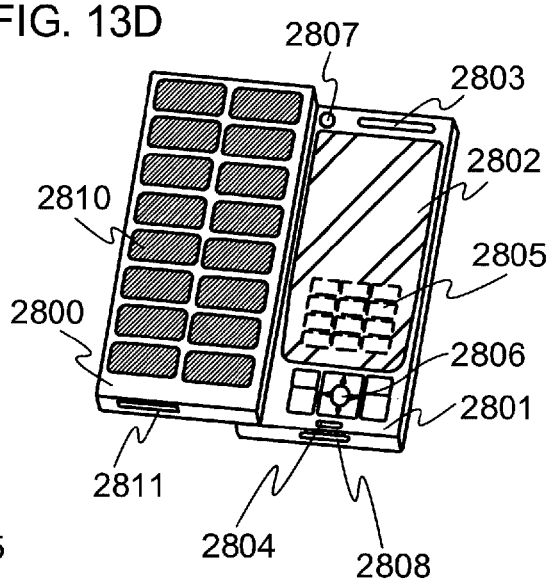

FIG. 13D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar battery 2810 having a function of charge of the mobile phone, an external memory slot 2811, and the like. Further, an antenna is incorporated in the housing 2801.

Further, the display panel 2802 includes a touch panel. A plurality of operation keys 2805 which are displayed as images are indicated by dashed lines in FIG. 13D. Note that a boosting circuit by which a voltage output from the solar battery 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 13D can overlap with each other by sliding; thus, the size of the mobile phone can be decreased, which makes the mobile phone suitable for being carried.

The external connection terminal 2808 can be connected to an AC adapter and various types of cables such as a USB cable, and charge and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided. By using the semiconductor device described in any of the above embodiments, a highly reliable mobile phone can be provided.

Figure 13E:
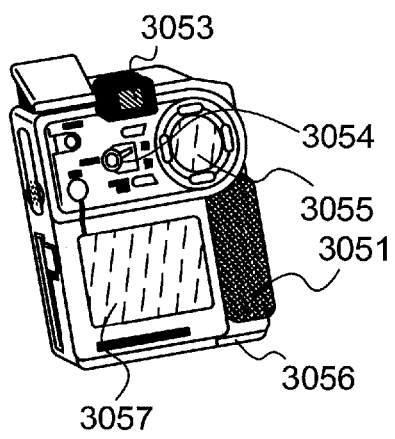

FIG. 13E illustrates a digital video camera which includes a main body 3051, a display portion A 3057, an eyepiece 3053, an operation switch 3054, a display portion B 3055, a battery 3056, and the like. By using the semiconductor device described in any of the above embodiments, a highly reliable digital video camera can be provided.

Figure 13F:
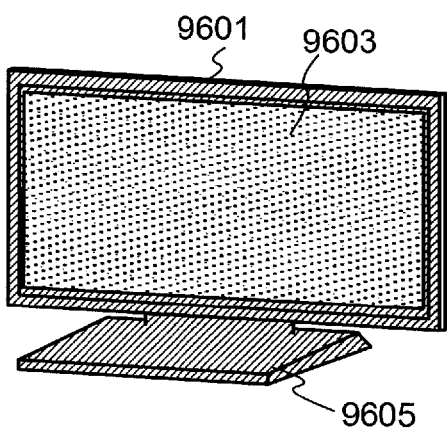

FIG. 13F illustrates an example of a television set. In the television set, a display portion 9603 is incorporated in a housing 9601. The display portion 9603 can display images. Here, the housing 9601 is supported by a stand 9605. By using the semiconductor device described in any of the above embodiments, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) data communication can be performed.

This embodiment can be implemented in appropriate combination with the structure described in any of other embodiments.

This application is based on Japanese Patent Application serial No. 2010-103472 filed with Japan Patent Office on Apr. 28, 2010, the entire contents of which are hereby incorporated by reference.

The invention claimed is:

1. A method of manufacturing a semiconductor device, comprising the steps of:
    forming a first insulating layer;
    performing a plasma treatment using a chlorine gas to concurrently introduce chlorine and oxygen to the first insulating layer;
    forming an oxide semiconductor layer over the first insulating layer;
    forming a second insulating layer over the oxide semiconductor layer;
    introducing oxygen to the oxide semiconductor layer through the second insulating layer;
    performing a heat treatment on the oxide semiconductor layer;
    etching a part of the second insulating layer after performing the heat treatment; and
    forming a source electrode and a drain electrode electrically connected to the oxide semiconductor layer after introducing the oxygen to the oxide semiconductor layer.

2. The method of manufacturing a semiconductor device according to claim 1, wherein the oxide semiconductor layer and the second insulating layer are etched at a same step.

3. The method of manufacturing a semiconductor device according to claim 1, wherein the second insulating layer is an island-shape.

4. The method of manufacturing a semiconductor device according to claim 1, wherein the second insulating layer is formed only over a channel formation region of the oxide semiconductor layer.

5. The method of manufacturing a semiconductor device according to claim 1, wherein the second insulating layer comprises gallium oxide.

6. The method of manufacturing a semiconductor device according to claim 1, wherein the oxide semiconductor layer comprises In and Ga.

7. The method of manufacturing a semiconductor device according to claim 1, wherein the oxygen introduced to the oxide semiconductor layer comprises an oxygen radical or an oxygen ion.

8. A method of manufacturing a semiconductor device, comprising the steps of:
    forming a gate electrode over a substrate;
    forming a gate insulating layer over the gate electrode;
    performing a plasma treatment using a chlorine gas to concurrently introduce chlorine and oxygen to the gate insulating layer;
    forming an oxide semiconductor layer over the gate insulating layer;
    forming an insulating layer over the oxide semiconductor layer;
    introducing oxygen to the oxide semiconductor layer through the insulating layer;
    performing a heat treatment on the oxide semiconductor layer;
    etching a part of the insulating layer after performing the heat treatment; and
    forming a source electrode and a drain electrode electrically connected to the oxide semiconductor layer after introducing the oxygen to the oxide semiconductor layer.

9. The method of manufacturing a semiconductor device according to claim 8, wherein the oxide semiconductor layer and the insulating layer are etched at a same step.

10. The method of manufacturing a semiconductor device according to claim 8, wherein the insulating layer is an island-shape.

11. The method of manufacturing a semiconductor device according to claim 8, wherein the insulating layer is formed only over a channel formation region of the oxide semiconductor layer.

12. The method of manufacturing a semiconductor device according to claim 8, wherein the insulating layer comprises gallium oxide.

13. The method of manufacturing a semiconductor device according to claim 8, wherein the oxide semiconductor layer comprises In and Ga.

14. The method of manufacturing a semiconductor device according to claim 8, wherein the oxygen introduced to the oxide semiconductor layer comprises an oxygen radical or an oxygen ion.

* * * * *